(12) United States Patent
Daruwalla et al.

(10) Patent No.: US 11,239,803 B2
(45) Date of Patent: *Feb. 1, 2022

(54) RUGGEDNESS PROTECTION CIRCUIT

(71) Applicant: pSemi Corporation, San Diego, CA (US)

(72) Inventors: Parvez Daruwalla, San Diego, CA (US); David Kovac, Arlington Heights, IL (US)

(73) Assignee: PSEMI CORPORATION, San Diego, CA (US)

( * ) Notice: Subject to any disclaimer, the term of this patent is extended or adjusted under 35 U.S.C. 154(b) by 45 days.

This patent is subject to a terminal disclaimer.

(21) Appl. No.: 16/743,638

(22) Filed: Jan. 15, 2020

(65) Prior Publication Data

US 2021/0083631 A1 Mar. 18, 2021

Related U.S. Application Data

(63) Continuation-in-part of application No. 16/574,036, filed on Sep. 17, 2019.

(51) Int. Cl.
*H03F 1/52* (2006.01)
*H03F 3/193* (2006.01)
*H03F 1/26* (2006.01)
*H03F 1/02* (2006.01)

(52) U.S. Cl.
CPC ........... *H03F 1/523* (2013.01); *H03F 1/0222* (2013.01); *H03F 1/26* (2013.01); *H03F 3/193* (2013.01); *H03F 2200/294* (2013.01)

(58) Field of Classification Search
CPC ........ H03F 1/523; H03F 3/193; H03F 1/0222; H03F 1/26; H03F 2200/294; H03F 3/72; H03F 2200/111; H03F 2203/7209; H03F 2200/451
USPC .......................................... 330/302, 277, 311
See application file for complete search history.

(56) References Cited

U.S. PATENT DOCUMENTS

| | | | |
|---|---|---|---|
| 6,804,502 B2 | 10/2004 | Burgener et al. | |
| 7,910,993 B2 | 3/2011 | Brindle et al. | |
| 8,018,285 B2 | 9/2011 | Kim et al. | |
| 8,928,388 B2 | 1/2015 | Lu et al. | |
| 8,942,121 B2 | 1/2015 | Kamerman | |
| 10,236,921 B1 | 3/2019 | Kohlhepp | |
| 10,348,262 B2 * | 7/2019 | Lee | H03F 1/223 |

(Continued)

OTHER PUBLICATIONS

Notice of Allowance for U.S. Appl. No. 16/574,036 dated Jan. 27, 2021, 10 pages.

*Primary Examiner* — Hieu P Nguyen
(74) *Attorney, Agent, or Firm* — Steinfl + Bruno LLP

(57) ABSTRACT

Various methods and circuital arrangements for protection of an RF amplifier are presented. According to one aspect, the RF amplifier is part of switchable RF paths that may include at least one path with one or more attenuators or switches that can be used during normal operation to define different modes of operation of the at least one path. An RF level detector monitors a level of an RF signal during operation of any one of the switchable RF paths and may control the attenuators or switches to provide an attenuation of the RF signal according to a desired level of protection at an input and/or output of the RF amplifier. According to another aspect, the RF level detector may control a switch to force the RF signal through a different switchable RF path.

28 Claims, 28 Drawing Sheets

(56) References Cited

U.S. PATENT DOCUMENTS 10,461,704 B2    10/2019  Khushali et al.
10,594,268 B2 *  3/2020  Smith, Jr. .............. H04B 17/13

* cited by examiner

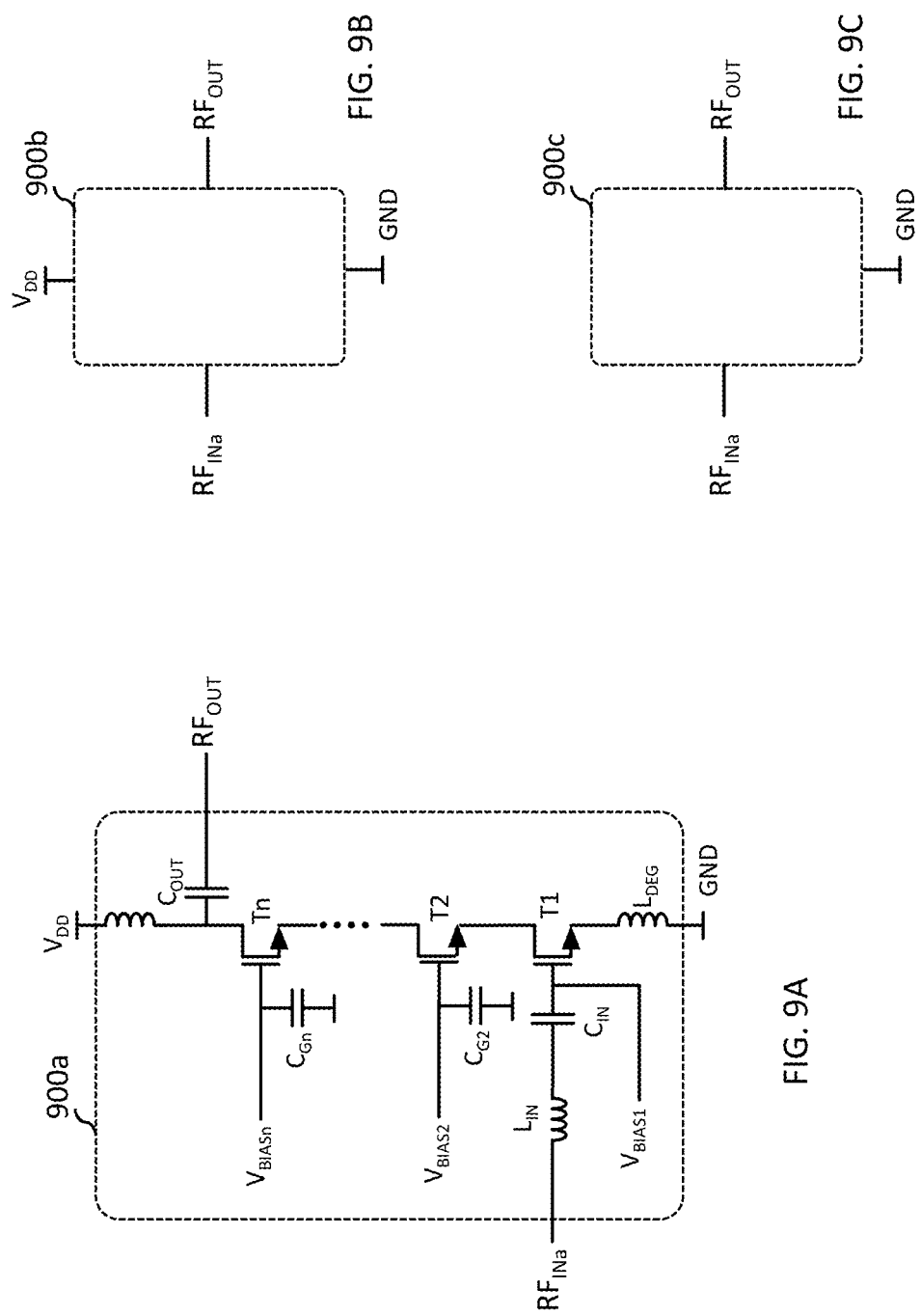

RUGGEDNESS PROTECTION CIRCUIT

CROSS-REFERENCE TO RELATED APPLICATIONS

The present application is a continuation in part of U.S. application Ser. No. 16/574,036, filed on Sep. 17, 2019, entitled "Ruggedness Protection Circuit", the disclosure of which is incorporated herein by reference in its entirety.

The present application may be related to U.S. Pat. No. 8,928,388 B2, issued on Jan. 6, 2015, entitled "Self-Activating Adjustable Power Limiter", the disclosure of which is incorporated herein by reference in its entirety. The present application may also be related to U.S. Pat. No. 6,804,502, issued on Oct. 12, 2004 and entitled "Switch Circuit and Method of Switching Radio Frequency Signals", the disclosure of which is incorporated herein by reference in its entirety. The present application may also be related to U.S. Pat. No. 7,910,993, issued on Mar. 22, 2011 and entitled "Method and Apparatus for use in Improving Linearity of MOSFET's using an Accumulated Charge Sink", the disclosure of which is incorporated herein by reference in its entirety. The present application may also be related to U.S. Pat. No. 10,461,704, issued on Oct. 29, 2019 and entitled "Switchless Multi Input Stacked Transistor Amplifier Tree Structure", the disclosure of which is incorporated herein by reference in its entirety.

TECHNICAL FIELD

The present application relates to amplifiers. In particular, the present application relates to ruggedness improvement circuits for amplifiers used in radio frequency (RF) applications.

BACKGROUND

FIG. 1 shows a simplified prior art circuit (100) that includes protection circuit elements (115) and (120) respectively coupled to an input and an output of an RF amplifier (105). In particular, the protection circuit (115) coupled to the input, IN, of the amplifier (105) may be used for ruggedness protection of the RF amplifier (105) by hard limiting (i.e., clipping) peak amplitudes of an RF signal, $RF_{IN}$, provided to the input, IN, of the amplifier (105). As shown in FIG. 1, a commonly used protection circuit (115) for ruggedness protection of the amplifier (105) may be a clamp circuit (115a, 115b) that comprises two (e.g., Zener or PN junction diodes or diode-connected MOSFETs) diodes, (115a) and (115b), connected in antiparallel for limiting (to a fixed level defined by the diodes) each of a positive peak amplitude and a negative peak amplitude of the input RF signal, $RF_{IN}$, to the amplifier (105). Furthermore, the protection circuit (120) coupled to the output, OUT, of the amplifier (105) may be used for protection of downstream (active) elements coupled to the output, OUT, of the amplifier (105) by limiting an amplitude (i.e., power) of an RF signal, $RF_{OUT}$, coupled to such downstream elements. As shown in FIG. 1, the protection circuit (120) may include a clamp circuit (122) that is configured to limit power at the output, OUT, of the amplifier, to a first (fixed) level via two diode connected transistors (122a) and (122b) connected in antiparallel, the first (fixed) level being defined, for example, by a threshold voltage, Vth, of the transistors (122a, 122b). In addition, the protection circuit (120) may further include a programmable attenuator (125), coupled to the output, OUT, of the amplifier (120), which can further limit the power of the RF signal, $RF_{OUT}$ according to a programmable level. Such programmable level may be in view of, for example, different gain modes of the amplifier (105) and/or integration of the amplifier (105) into different target RF systems as shown in FIG. 2A later described.

In some applications it may be desirable to provide protection circuits that can clamp voltages at the input, IN, and the output, OUT, of the amplifier (105) at different clamp levels depending on, for example, different gain modes and/or different frequencies of operation of the circuit. Furthermore, it may be desirable that such protection circuits, while maintaining an efficient protection of an amplifier or other active devices, reduce a physical area of the circuit as well as production cost by removing, for example, some of the higher cost and bulkier components of the prior art circuit shown in FIG. 1. This is the object of the teachings according to the present disclosure.

SUMMARY

The various teachings according to the present disclosure describe methods and circuits (i.e., circuital arrangements) for protection of an RF amplifiers and/or other active RF devices according to programmable clamping levels, thereby removing, for example, requirement for the fixed level clamp circuit (115a, 115b) and/or (122a, 122b) used in the prior art circuit of FIG. 1. As will be later described, such methods and circuits can also be used to protect other active or passive RF devices susceptible to damage when subjected to higher RF voltages.

According to a first aspect of the present disclosure, a circuital arrangement is presented, the circuital arrangement comprising: a plurality of switchable RF paths comprising an RF amplifier, each switchable RF path comprising a respective coupling switch that is configured to selectively couple an RF signal to an input of the RF amplifier; and an RF level detector circuit that is coupled to the plurality of switchable RF paths, wherein the RF level detector circuit is configured to detect a voltage level of the RF signal through a selected path of the plurality of switchable RF paths, the RF signal coupled to the input of the RF amplifier via the respective coupling switch, and if a corresponding detected voltage level is above a reference trip voltage, the RF level detector circuit is configured to generate a control signal to switch a state of the respective coupling switch from an ON state to an OFF state.

According to a second aspect of the present disclosure, a method for protecting an amplifier from higher voltage is presented, the method comprising: providing a plurality of switchable RF paths for processing an RF signal through one amplifier according to different modes of operation, each switchable RF path comprising a respective coupling switch that is configured to selectively couple an RF signal to an input of the RF amplifier; selecting a mode of operation; based on the selecting, selecting a path of the plurality of switchable RF path for processing of the RF signal, the selecting comprising controlling a respective coupling switch of a selected path for operation in an ON state; based on the selecting, providing a flow of the RF signal through the respective coupling switch of the selected path and through the amplifier; detecting a voltage level of the RF signal through the selected path; and based on the detecting, if a detected voltage level is above a reference trip voltage, then controlling the respective coupling switch of the selected path for operation in an OFF state, thereby providing a level of isolation of the input of the RF amplifier from the RF signal to protect the RF amplifier.

According to a third aspect of the present disclosure, a circuital arrangement is presented, the circuital arrangement comprising: a plurality of switchable RF paths comprising an RF device, each switchable RF path comprising a respective coupling switch that is configured to selectively couple an RF signal to an input of the RF device; and an RF level detector circuit that is coupled to the plurality of switchable RF paths, wherein the RF level detector circuit is configured to detect a voltage level of the RF signal through a selected path of the plurality of switchable RF paths, the RF signal coupled to the input of the RF device via the respective coupling switch, and if a corresponding detected voltage level is above a reference trip voltage, the RF level detector circuit is configured to generate a control signal to switch a state of the respective coupling switch from an ON state to an OFF state.

According to a fourth aspect of the present disclosure, a circuital arrangement is presented, the circuital arrangement comprising: a plurality of switchable RF paths comprising an RF amplifier, each switchable RF path comprising a respective coupling switch that is configured to selectively couple an RF signal to an input of the RF amplifier; and an RF level detector circuit that is coupled to the plurality of switchable RF paths, wherein the RF level detector circuit is configured to detect a voltage level of the RF signal through a selected path of the plurality of switchable RF paths, the RF signal coupled to the input of the RF amplifier via the respective coupling switch, and if a corresponding detected voltage level is above a reference trip voltage, the RF level detector circuit is configured to generate a control signal to change a level of a biasing voltage to the RF amplifier.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 9A shows an exemplary multi-stage cascode amplifier.

FIG. 9B shows an active RF device for processing an input RF signal and generating therefrom an output RF signal.

FIG. 9C shows a passive RF device for processing an input RF signal and generating therefrom an output RF signal.

11B shows another embodiment according to the present disclosure wherein the protection circuit elements protect a multi-input multi-stage cascode amplifier by controlling biasing signals to input transistors of the amplifier.

Figure 12:
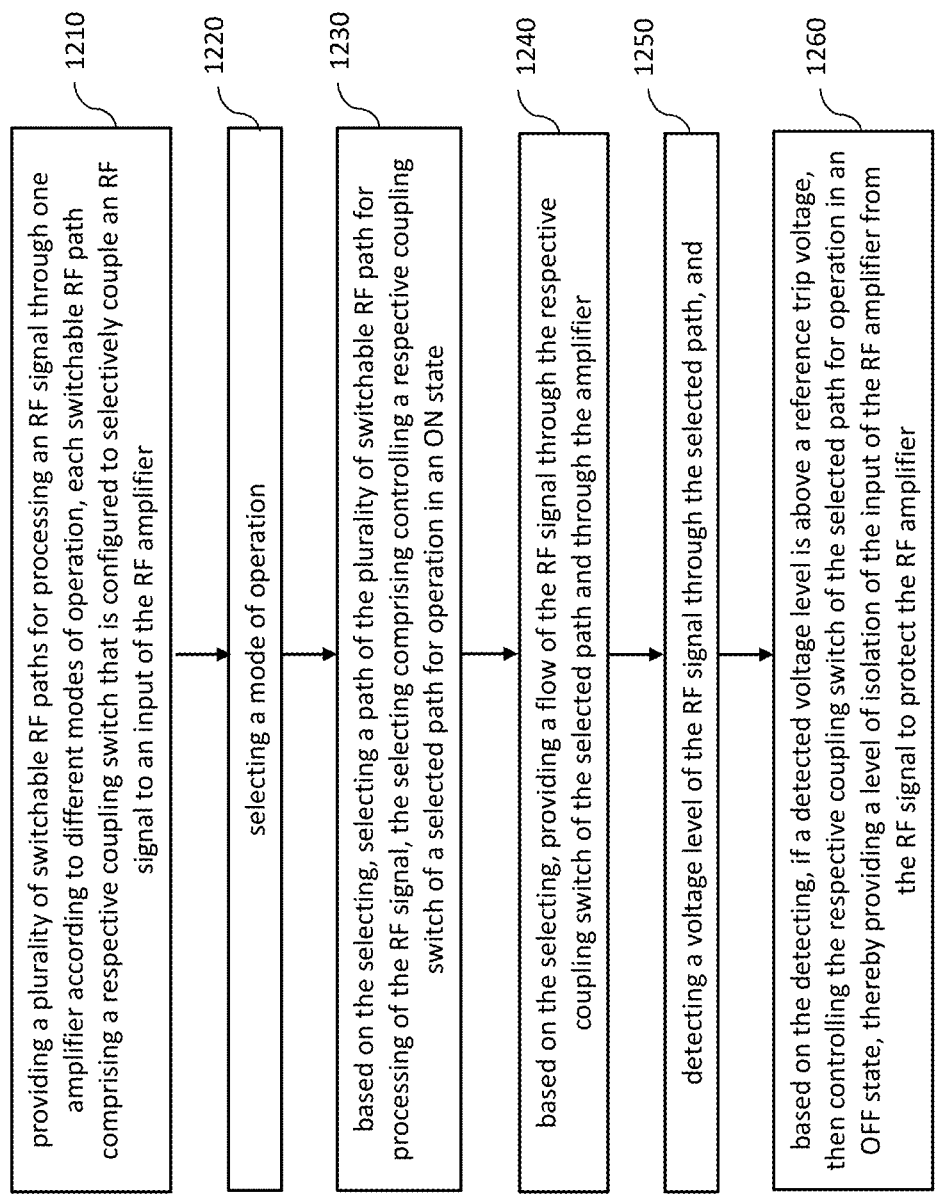

FIG. 12 is a process chart showing various steps of a method according to an embodiment of the present disclosure for protecting an amplifier from higher voltage.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 1:
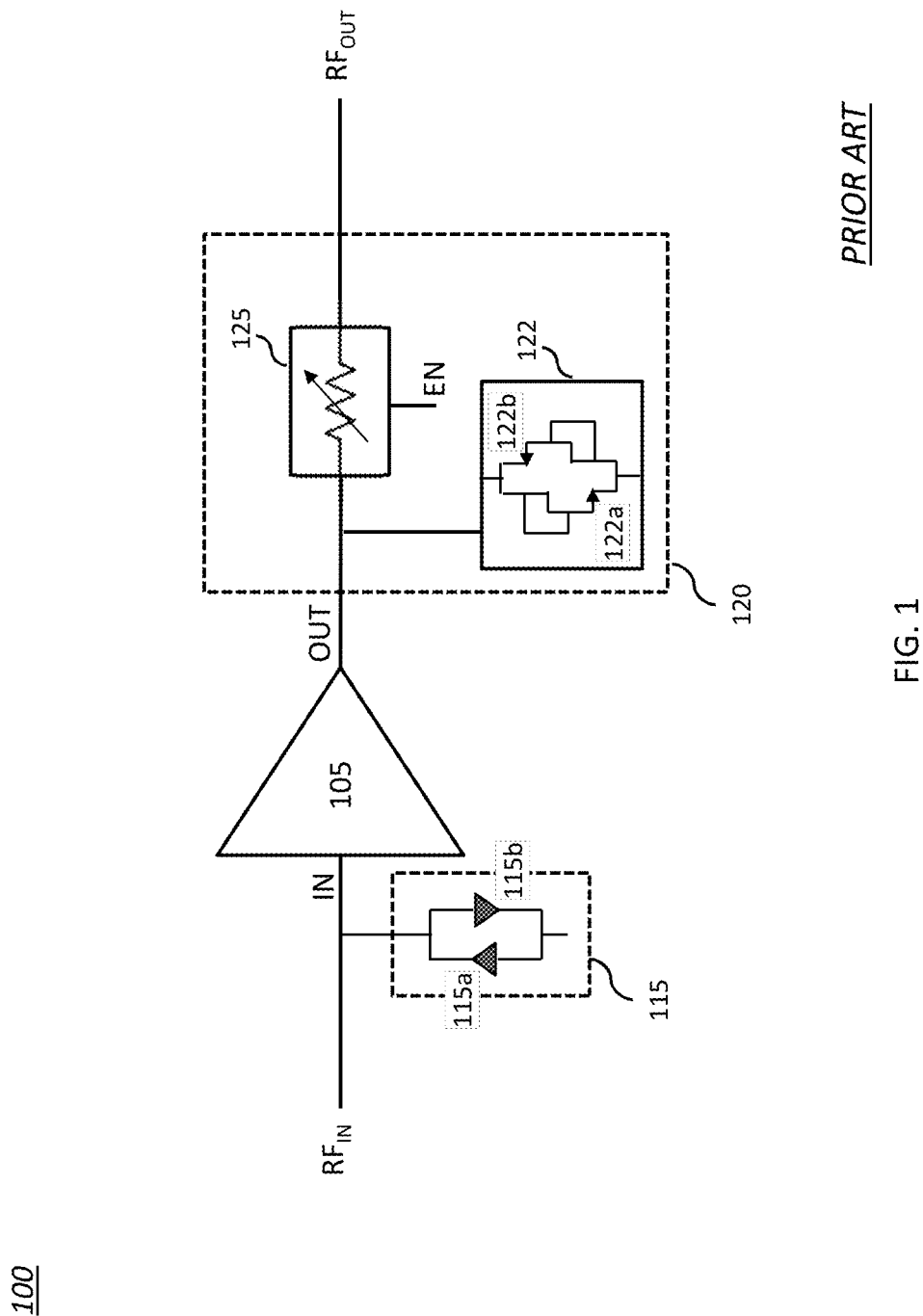
FIG. 1 shows a simplified prior art circuit that includes protection circuit elements respectively coupled to an input and an output of an RF amplifier.
Figure 2A:
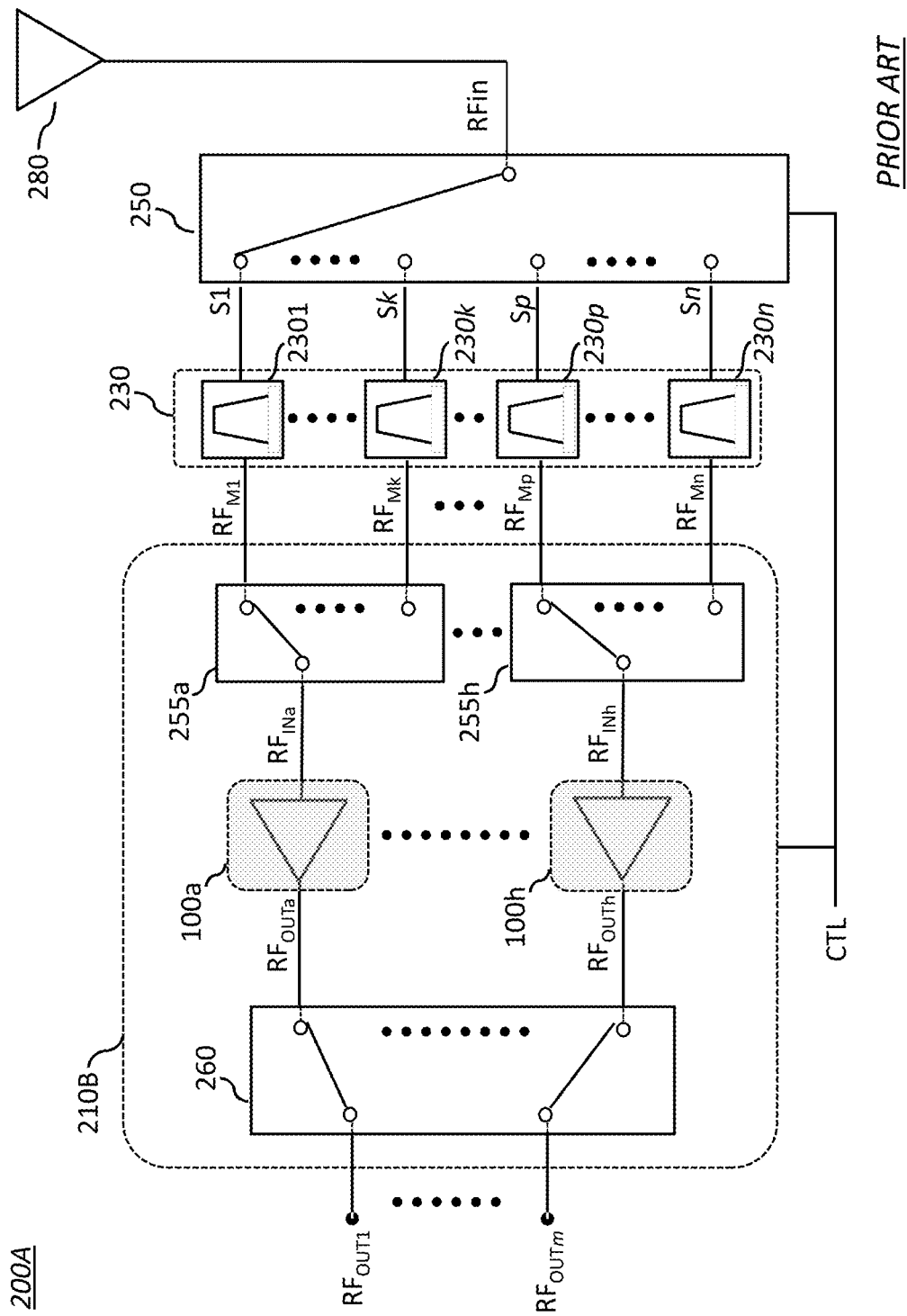
FIG. 2A shows a simplified block diagram of a prior art RF front-end stage which can be used for RF reception of multiple modes and multiple frequency bands signals via an antenna and through various low noise amplifier (LNA) circuits.

FIG. 2A shows a block diagram of an exemplary target RF system (200A) using the amplifier (105) in low noise amplifier (LNA) circuits (100a, ..., 100h) each comprising elements similar to the elements of the circuit (100) described in FIG. 1. A person skilled in the art would recognize that FIG. 2A represents a simplified block diagram of a prior art RF front-end stage which can be used for RF reception of multiple modes and multiple frequency bands signals via an antenna (280) and through the LNA circuits (100a, ..., 100h) according to a plurality of switchable RF paths. A person skilled in the art would realize that the block diagram depicted in FIG. 2A may also include transmit paths (not shown) coupled to antenna (280) for RF transmission of the multiple modes and multiple frequency band signals via the same antenna (280).

As can be seen in FIG. 2A, an antenna switch (250) may be used to switch an input RF signal, $RF_{IN}$, detected at the antenna, (280), to one of a plurality of selectable (i.e., switchable) RF paths, each comprising, for example, a filter (2301, ..., 230n), wherein each of the plurality of selectable RF paths processes the detected $RF_{IN}$ signal according to a corresponding mode (e.g., gain mode) and/or band (e.g., frequency) of operation. Band input switches (255a, ..., 255h) may be used to, for example, route filtered versions ($RF_{M1}, ..., RF_{Mn}$) of the $RF_{IN}$ signal through the filters (2301, ..., 230n) to a corresponding LNA (100a, ..., 100h) for further processing according to, for example, a specific band and/or a specific (RF) gain mode. For example, as shown in FIG. 2A, a first band input switch (255a) may selectively couple one of a plurality of filtered RF signals ($RF_{M1}, ..., RF_{Mk}$) to the LNA (100a), and a second band input switch (255h) may selectively couple one of a plurality of filtered RF signals ($RF_{Mp}, ..., RF_{Mn}$) to the LNA (100h). In turn, an output RF signal (e.g., $RF_{OUTa}, ..., RF_{OUTh}$) processed by each of the LNAs (100a, ..., 100h) of the receive paths can be selectively routed for downstream processing (e.g. via a transceiver, not shown) by way of an output switch (260). In the exemplary configuration shown in FIG. 2A, the output switch (260) may effectively include one or more switches similar to the switches (255a, ..., 255h), each selectively outputting a respective RF signal, $RF_{OUT1}, ..., RF_{OUTm}$, from a different group of processed RF signals through the plurality of selectable paths. Control of the antenna switch (250), the band input switches (255a, ..., 255h), and the output switch (260) through control signal, CTL, may be based on, or provided by, a controller (e.g., microcontroller, processor, microprocessor, etc.) that is aware of a selected mode and/or band of operation of the RF front-end stage (200A), such as, for example, a transceiver unit (not shown). As clearly understood by a person skilled in the art, in some exemplary configurations, elements (255a, ..., 255h, 100a, ..., 100h, 260) may be monolithically integrated as a chip and/or part of a module (210B) that is fitted into the target RF system (200A). In some cases, even the antenna switch (250) may be included in such integrated chip.

Figure 2B:
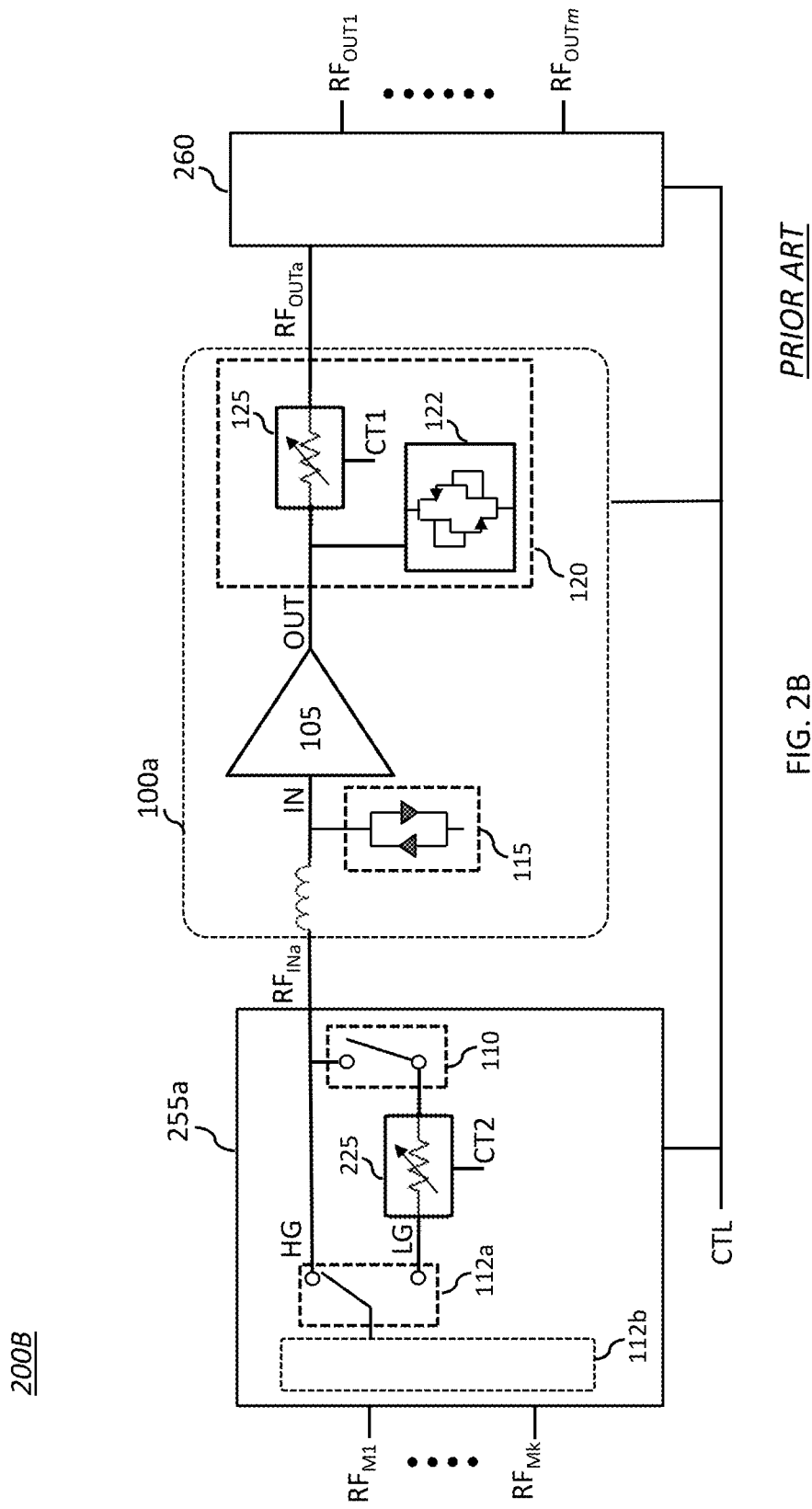
FIG. 2B shows some details of switchable RF paths through an LNA circuit of the front-end stage shown in FIG. 2A, including protection circuit elements of the LNA circuit.

FIG. 2B shows some details of switchable RF paths through the prior art LNA circuit (100a) of the front-end stage (200A) shown in FIG. 2A, including protection circuit elements (115) and (120) of the LNA circuit (100a) described above. In particular, FIG. 2B shows two switchable RF paths corresponding to two different modes of operation of the front-end stage (200A) and therefore of the LNA circuit (100a). Such modes of operation may correspond to different gain modes, such as a high gain mode through a path identified in the FIG. 2B as HG, and a low gain mode through a path identified in the FIG. 2B as LG. As shown in FIG. 2B, the band input switch (255a) may include a switching matrix (112b) that can selectively couple one of a plurality of the filtered RF signals ($RF_{M1}, ..., RF_{Mk}$) to a switch (112a) which in turn may selectively route the coupled filtered RF signal to the high gain mode, HG, path, or to the low gain mode, LG path, under control of the control signal, CTL. It should be noted that a person skilled in the art is well aware of various switching topologies used in the band input switches (255a, ..., 255h), as exemplified in FIG. 2B with reference to the band input switch (255a). Although for clarity purposes the switch (112a) (e.g., shown as a single-pole double-throw switch) and switching matrix (112b) are shown as separate, they may indeed be part of a same switching matrix. Furthermore, it should be noted that the switch (112a) may not be limited to the exemplary single-pole double-throw (SPDT) switch shown in FIG. 2B, as a single-pole multiple-throw (SPMT) switch may be used for switching/processing of higher number of switchable paths beyond the HG and LG paths shown in FIG. 2B.

As can be seen in FIG. 2B, during operation in the high gain mode, the HG path may take an input RF signal (e.g., one of $RF_{M1}, ..., RF_{Mk}$) switched through a throw of the switch (112a) and feed unattenuated as $RF_{INa}$ to the LNA circuit (100a). On the other hand, during operation in the low gain mode, the LG path may take the same input RF signal (e.g., one of $RF_{M1}, \ldots, RF_{Mk}$) switched through a different throw (not shown in FIG. 2B) of the switch (112a) and feed an attenuated version of such signal as $RF_{INa}$ to the LNA circuit (100a), wherein attenuation of the input RF signal may be provided by a known in the art attenuator circuit (225). A control signal, CTL, may selectively couple an output of the attenuator circuit (225) to the input of the LNA circuit (100a) based on the low or high gain modes of operation. It should be noted that such switching of RF paths through switches (e.g., 110) for providing different levels of attenuation to an RF signal prior to feeding the RF signal to the LNA circuit (100a) are known in the art. In particular, a person skilled in the art would know that the attenuator (225) and switch (110) may be partitioned as being part of the (band input) switch (255a) as shown in FIG. 2B, or may be partitioned as part of a separate circuit, such as, for example, as part of the LNA circuit (100a) or even a standalone circuit. Furthermore, a person skilled in the art would clearly understand that the switch (255a) may include other switchable elements not explicitly shown in FIG. 2B.

With continued reference to FIG. 2B, a person skilled in the art would know that the attenuator (225) may be programmable/adjustable/configurable to operate according to a plurality of attenuation levels, which in turn may allow configuration of the LG path according to a plurality of different low gain modes of operation, each associated to a different attenuation level of the attenuator (225). As will be described later in the present disclosure, teachings according to the present disclosure may use such configurable attenuation levels of the attenuator (225) as a protection feature to an input of the amplifier (105) that is controlled to operate as an adjustable clamp based on a detected level of an RF signal input to either the HG or the LG paths, thereby allowing removal of the fixed clamp circuit (115) used in the prior art LNA circuit (100a).

With further reference to FIG. 2B, as described above, protection of downstream circuits coupled to the output of the LNA circuit (100a) may be provided by a programmable power clamp that is based on a combination of the fixed level clamp circuit (122) and the attenuator (125) coupled at the output, OUT, of the amplifier (105). Such combination may provide a programmable clamping level (and therefore power) that is based on the fixed clamp level of the clamp circuit (122) and a programmable attenuation level of the attenuator (125). As known by a person skilled in the art, such programmable power clamp that can allow different levels of power clamp may be a required feature in some configurations. A drawback of such configuration however is that the attenuator (125) must always be included in the signal path, which therefore provides a further attenuation to the RF signal through either the HG path or the LG path beyond what is required by a corresponding gain mode. As will be described later in the present disclosure, teachings according to the present disclosure may use the configurable attenuation levels of the attenuator (125) as a protection feature coupled to the output of the amplifier (105) that is controlled to operate as a clamp based on a detected level of an RF signal input to either the HG or the LG paths, thereby allowing removal of the fixed clamp circuit (122) used in the prior art LNA circuit (100a).

Figure 3A:
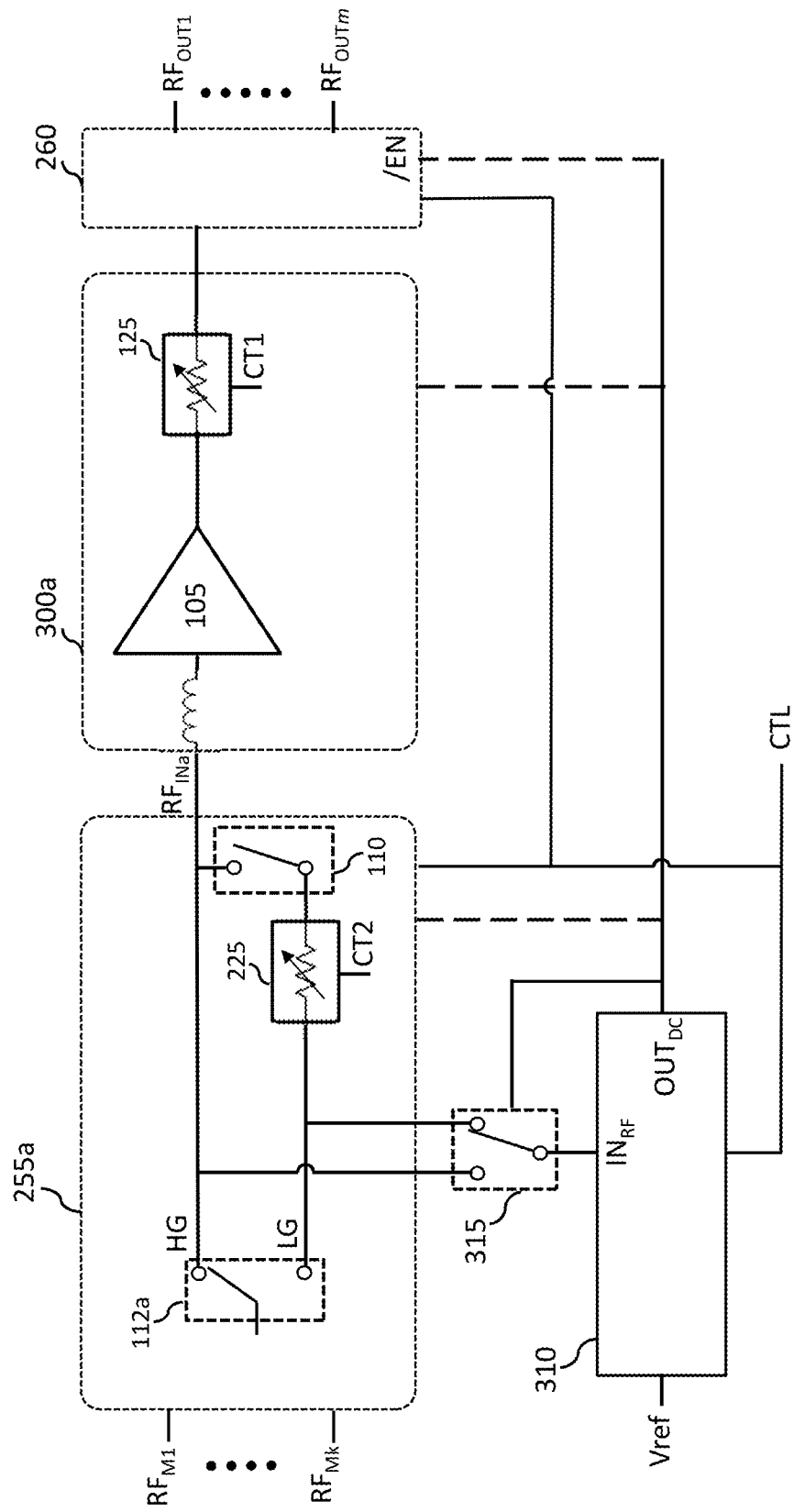
FIG. 3A shows details of switchable RF paths according to an exemplary embodiment of the present disclosure including protection circuits elements coupled to an LNA circuit, the protection circuit elements comprising a programmable RF level detector.

FIG. 3A shows details of switchable RF paths (HG, LG) according to an exemplary embodiment of the present disclosure including protection circuits elements (e.g., 110, 125, 225, 260, 310, 315) coupled to an LNA circuit (300a). Such switchable RF paths may be considered as paths of an RF front-end stage similar to one depicted in FIG. 2A. When comparing to the (HG, LG) paths of the prior art configuration described above, the two fixed level clamps (115, 122) are removed. Furthermore, the two attenuators (125) and (225) can be operated as clamps to respectively limit voltages at the output and the input of the LNA circuit (300a).

According to an embodiment of the present disclosure, control of the two attenuators (125, 225) shown in FIG. 3A, or any other of the protection circuit elements (110, 125, 225, 260), can be provided based on an RF level detected in the switchable RF paths (HG, LG) via a combination of a switch (315) and a programmable RF level detector circuit (310), wherein the switch (315) selectively couples an RF signal input to the paths (HG, LG) to an input, $IN_{RF}$, of the programmable RF level detector circuit (310). According to an exemplary embodiment of the present disclosure, as later described with reference to FIG. 4G, the attenuator (125) and/or the output switch (260) may be used as protection circuits at the output of the amplifier (105) such that upon detection of a level of the RF signal at the input, $IN_{RF}$, outside (e.g., above, larger than) a programmed level, the programmable RF level detector circuit (310) may force a further attenuation of the RF signal via the attenuator (125) and/or decouple the RF signal from downstream circuits via the output switch (260). It should be noted that in FIG. 3A, as well as FIGS. 4A-4G later described, control lines from the programmable RF level detector circuit (310, $OUT_{DC}$) to the blocks (225a, 300a, 260) that include the protection circuit elements (110, 125, 225, 260) are shown as broken lines to indicate possible control of such protection circuit elements, and are shown as solid lines when any protection element of a block is effectively controlled to operate as a protection element as a consequence of a detected high value of an RF level.

With continued reference to FIG. 3A, according to an embodiment of the present disclosure, upon detection of a level of the RF signal at the input, $IN_{RF}$, outside (e.g., above, larger than) a programmed level, the programmable RF level detector circuit (310) may force flow of the RF signal through the LG path (e.g., by controlling switch (255a) to override normal operation) and control, either directly or indirectly, one or more of the protection circuit elements (110, 125, 225, 260) to operate as protection circuits to the input of the amplifier (105) or at the output of the amplifier (105). Such direct or indirect control may be based on design choice and/or other integration factors. For example, according to some exemplary embodiments of the present disclosure, the circuit elements shown in FIG. 3A may be part of an integrated multi-gain mode and multi-band LNA module (e.g., 210B shown in FIG. 2A) controlled through an external control signal (e.g., CTL) and including some local intelligence to translate the external control signal to configurations of internal elements of such module (e.g., 210B), including of one or more of the protection circuit elements (110, 125, 225, 260, 310, 315), as well as selection/switching of the HG and LG paths as active processing paths (i.e., selective coupling of such paths to an input RF signal), including capability to override configuration dictated by the external control signal (e.g., CTL). According to other exemplary embodiments, only available intelligence may be external to the LNA module (e.g., 210B), and accordingly an external intelligence (e.g., a transceiver) may control the protection circuit elements based on an output, $OUT_{DC}$, of the programmable RF level detector circuit (310).

With further reference to FIG. 3A, according to an embodiment of the present disclosure, depending on a desired level of protection, the one or more of the protection circuit elements (110, 125, 225, 260) may be controlled based on the output, $OUT_{DC}$, of the programmable RF level detector circuit (310). For example, the attenuator (225) may be controlled to provide an adjustable level of attenuation in compliance with a desired clamping level at the input of the amplifier (105). Since the programmable RF level detector circuit (310) can detect a level or a range of the input RF signal to the paths (HG, LG), circuit (310) can establish a level of attenuation of such RF signal by the attenuator (225) to comply with the desired clamping level once the RF signal is forcibly routed though the LG path. Further protection of the input of the amplifier (105) may be provided by isolating the output of the attenuator (225) from the input of the amplifier (105) via the switch (110) (e.g., switch in OFF position as shown in FIG. 3A). On the other hand, protection at the output of the amplifier (105) may be provided by control of the attenuator (125) and/or the switch (260) in manners similar to the attenuator (225) and the switch (110). According to some exemplary embodiments of the present disclosure, the attenuators (125, 225) may be configured to shunt a programmable portion or all of the RF power to ground. It should be noted that the output, $OUT_{DC}$, of the programmable RF level detector circuit (310) may be provided via a single conductor or a plurality of conductors (signal lines) that carry control signals for controlling specific controllable elements shown in FIG. 3A, including the protection circuit elements (110, 125, 225, 260) and the switch (112a). Such control may be concurrent to the control provided by the external control signal, CTL, and in some cases overriding such external control.

With continued reference to FIG. 3A, according to an exemplary embodiment of the present disclosure, once the programmable RF level detector circuit (310) detects a level of the RF signal at the input, $IN_{RF}$, inside (e.g., below, smaller than) the programmed level, the programmable RF level detector circuit (310) may restore normal flow of the RF signal through one of the LG and HG paths according to, for example, a selected gain mode. It should be noted that the programmed level can be different for different gain modes and/or different frequencies of operation (e.g., bands) of the circuit when considering the same HG and LG paths. As previously noted, other processing paths beyond the HG and LG paths shown in FIG. 3A may be present.

Figure 3B:
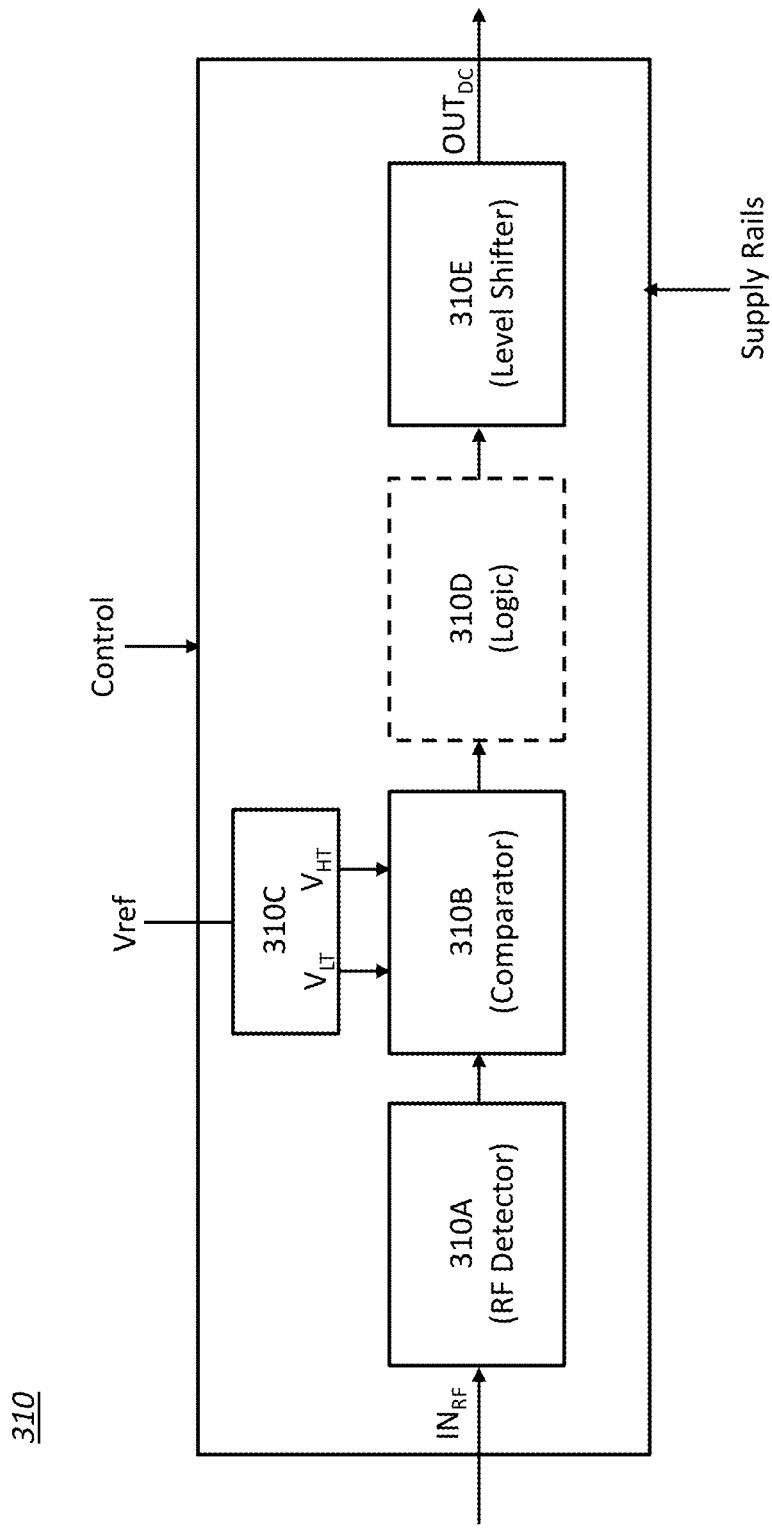
FIG. 3B shows a simplified block diagram according to an embodiment of the present disclosure of the programmable RF level detector shown in FIG. 3A.

FIG. 3B shows a simplified block diagram according to an embodiment of the present disclosure of the programmable RF level detector circuit (310) shown in FIG. 3A. As can be seen in FIG. 3B, the programmable RF level detector circuit (310) according to the present teachings comprises: i) an RF detector circuit block (310A) that is configured to generate a DC voltage corresponding to a peak amplitude of an RF signal provides at an input node, $IN_{RF}$, of the programmable RF level detector (310); ii) a comparator circuit block (310B) that is configured to compare the DC voltage output by the block (310A) to a reference high trip voltage $V_{HT}$ and a reference low trip voltage $V_{LT}$, and output a digital signal (e.g., 0 or 1) depending on a result of the comparison; iii) a trip voltage generator circuit block (310C) that is configured to programmatically generate the high and low trip voltages $V_{HT}$ and $V_{LT}$ based on input control signals (e.g., shown as Control in FIG. 3B) and a reference voltage Vref; iv) an optional control logic circuit block (310D) that is configured to receive control signals (e.g., shown as Control in FIG. 3B) or logic that may determine operation of the programmable RF level detector (310); and a level shifter circuit block (310E) that is configured to translate/shift control signal levels output by the programmable RF level detector (310) at the output node, $OUT_{DC}$. It should be noted that although the various blocks (310A, . . . , 310E) are described herein in functional terms, a person skilled in the art would know of many different specific circuit designs to implement functions of each such blocks. Applicant considers that circuit details of the blocks (310A, . . . , 310E) may be considered as design choice and therefore outside the scope of the present disclosure, although some exemplary non-limiting designs are provided in FIGS. 3C, 3D and 3E. It should be noted that for clarity reasons, various supply and reference voltages used to power the blocks shown in FIG. 3B are not shown. A person skilled in the art is well aware that such supplies exist.

With continued reference to FIG. 3B, according to a further embodiment of the present disclosure, the control signals output at the output node, $OUT_{DC}$, of the programmable RF level detector (310) may control each of the protection circuit elements (110, 125, 225, 260) in view of different detected programmable levels of RF signal. For example, for: a) levels detected between the high and low trip voltages $V_{HT}$ and $V_{LT}$, a subset of such protection circuit elements (110, 125, 225, 260) may be activated, and b) for levels above the high trip voltage $V_{HT}$, remaining of the protection circuits elements may be activated. According to some exemplary embodiments, activation between one of the two cases a) and b) may include engaging the attenuators (125, 225) at different levels of attenuation, such as, for example, a higher level of attenuation in the b) case. This can be extended to activation of one or more of the protection circuit elements (110, 125, 225, 260) according to more than two levels detected via the high and low trip voltages $V_{HT}$ and $V_{LT}$, implementation of which may be considered a mere design example.

Figure 3D:
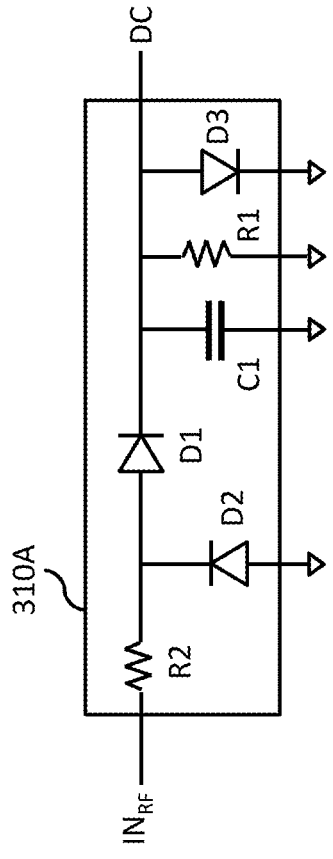
FIG. 3C and FIG. 3D show respective exemplary circuits of an RF level detector that can be used in the programmable RF level detector of FIG. 3B.
Figure 3C:
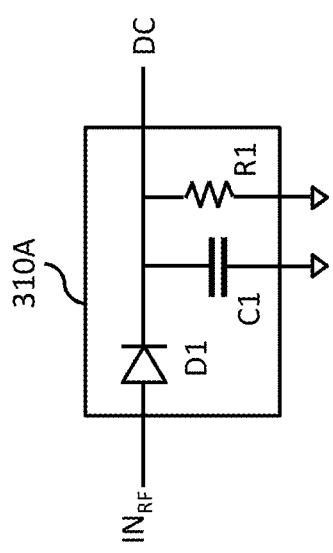

According to an embodiment of the present disclosure, the RF detector circuit block (310A) may be any known in the art RF detector circuit that can operate at frequencies of the RF signal processed through the LG and HG paths, such as, for example, circuits shown in FIG. 3C and FIG. 3D. FIG. 3C shows a well known in the art RF detector circuit that uses a series connected diode D1 at its input, followed by shunted parallel capacitor C1 and resistor R1, to provide a DC signal at the output node, DC, that has a voltage level that corresponds to a peak amplitude of the RF signal provided to the input node, $IN_{RF}$. A reduced level of loading of the RF signal by the RF detector circuit block (310A) may be obtained by using the RF detector circuit shown in FIG. 3D. A series connected resistor R2 at the input of such RF detector circuit can provide further isolation and reduced loading when compared to the circuit shown in FIG. 3C. A diode D2 coupled to the input of the RF detector circuit can further protect the circuit from RF overvoltage, whereas a diode D3 coupled at the output can limit the output DC level to protect the following block (310B). It should be noted that such exemplary circuits shown in FIG. 3C and FIG. 3D should not be considered as limiting the scope of the present application, as other RF detector circuits may be used.

Figure 3E:
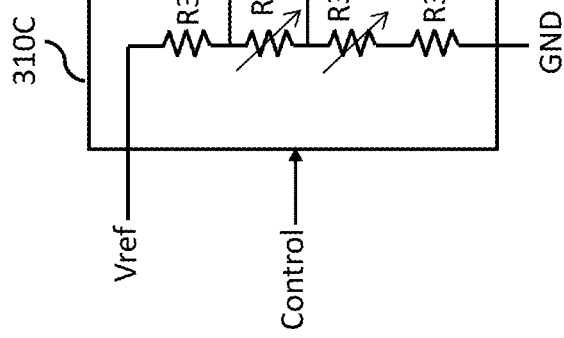
FIG. 3E shows an exemplary circuit according to an embodiment of the present disclosure for providing a reference low trip voltage and a reference high trip voltage to a comparator used in the programmable RF level detector of FIG. 3B.

FIG. 3E shows an exemplary circuit according to an embodiment of the present disclosure that can be used as the circuit block (310C) for providing the low trip voltage $V_{LT}$ and the high trip voltage $V_{HT}$ to the comparator circuit block (310B) used in the programmable RF level detector (310) of FIG. 3B. As can be seen in FIG. 3E, the trip voltages $V_{LT}$ and $V_{HT}$ are generated via a resistive ladder network (R31, . . . , R34) that includes series connected resistors R31, R32, R33 and R34, coupled between a reference voltage, Vref, and a reference ground, GND. As shown in FIG. 3E, a voltage difference between the high trip voltage $V_{HT}$ and the low trip voltage $V_{LT}$ may be provided by a voltage drop across a resistor R32, and the low trip voltage $V_{LT}$ may be provided by a ratio of sum of resistor values R33+R34 to the sum of resistor values (R31+R32+R33+R34). It should be noted that although resistors R33 and R34 are shown as separate in FIG. 3E, these may obviously be merged into one (programmable) resistor.

With further reference to FIG. 3E, according to some exemplary embodiments, one or more of the resistors, such as for example R32 and R33, can have programmable resistor values to allow control (e.g., via Control line shown in FIG. 3E, which may be, for example, the same CTL control signal of FIG. 3A) of the protection circuit elements (110, 125, 225, 260) based on different peak amplitude values of the RF signal detected by the programmable RF level detector circuit (310). In other words, teachings according to the present disclosure can provide programmable clamping levels at either input or output of an active device (e.g., amplifier 105 of FIG. 3A), wherein the programmable levels may be based on different gain modes and/or frequencies of operation of the switchable paths (e., LG, HG of FIG. 3A). It should be noted that the resistive ladder network (R31, . . . , R34) of FIG. 3E may represent one non-limiting circuit implementation for generating (programmable) values of the low and high trip voltages $V_{LT}$ and $V_{HT}$, as a person skilled in the art would know of other possible circuit implementations which may be chosen based on design goals and performances. Such other implementations may include any one or more of passive (e.g., resistors, capacitors), active (e.g., operational amplifiers) and programmable devices (A/D converters, D/A converters, memory devices).

With continued reference to FIG. 3E, according to one embodiment of the present disclosure, the reference voltage, Vref, may be generated by a voltage source having a stable voltage value that accordingly may generate a stable current through the resistive ladder network (R31, . . . , R34) and through the comparator circuit block (310B). According to one exemplary non-limiting embodiment of the present disclosure, such voltage source may be a bandgap voltage reference that generates a stable and temperature independent reference voltage, Vref, of approximately 1.25 volts. Of course, a person skilled in the art would know of the other possible implementations for such voltage source.

With reference back to the programmable RF level detector circuit (310) of FIG. 3B, the comparator circuit block (310B) may output a digital signal (e.g., digital value 0 or 1) based on a comparison of a value of a DC voltage provided to the input of the comparator circuit block (310B) by the RF detector circuit block (310A) with the low and high trip voltages $V_{LT}$ and $V_{HT}$. For example, if the DC voltage is above the high trip voltage $V_{HT}$, the comparator may output a high digital value to indicate a detected RF voltage level above the high trip voltage $V_{HT}$, and if the DC voltage is below the low trip voltage $V_{LT}$, the comparator may output a low digital value to indicate a detected RF voltage level below the low trip voltages $V_{LT}$. Furthermore, according to an embodiment of the present disclosure, the comparator may not change state/level of the output digital signal for DC voltage values between the low trip voltage $V_{LT}$ and high trip voltage $V_{HT}$. In other words, in order to prevent mistriggering of the comparator circuit block (310B) in view of possible noise or other spurious voltages present on the DC voltage, the comparator circuit block (310B) may be implemented with a hysteresis having a value that is based on a difference in voltage between the low trip voltage $V_{LT}$ and high trip voltage $V_{HT}$.

As shown in FIG. 3B, the digital signal output by the comparator circuit block (310B) may be provided to the (optional) logic circuit block (310D). The logic circuit block (310D) may combine the digital signal output by the comparator circuit block (310B) with other control signals (e.g., labelled as Control in FIG. 3B) provided to the logic circuit block (310D) in order to establish effective control of any one or more of the protection circuit elements (110, 125, 225, 260) shown in FIG. 3A. As shown in FIG. 3A, according to some exemplary embodiments, the control signals to the logic circuit block (310D) may be based on the CTL control signal described above. The effective control of the one or more of the protection circuit elements (110, 125, 225, 260) in turn may require different voltage levels which can be provided by the level shifter circuit block (310E). To this end, as shown in FIG. 3B, supply rails carrying voltage levels and references used in elements of the switchable RF paths of FIG. 3A are provided to the level shifter circuit block (310E), based on which such level shifter adjusts levels of the control signals at the output, $OUT_{DC}$, for the effective control.

As described above, any one of the of the protection circuit elements (110, 125, 225, 260) may be controlled based on the output, $OUT_{DC}$, of the programmable RF level detector circuit (310). Design choice and/or performance goals may dictate which of the one or more protection circuit elements (110, 125, 225, 260) to control. FIGS. 4B, 4C, 4D, 4E, 4F and 4G show some possible non-limiting control configurations for protection at the input and/or the output of the amplifier (105) during an exemplary signal flow through the high gain path HG shown in FIG. 4A. As previously described, each such protection circuit element may be controlled via a specific control provided by the output, $OUT_{DC}$, of the programmable RF level detector. Such specific control may be via dedicated signal lines of the output, $OUT_{DC}$, or via common signal lines that carry specific control logic. A person skilled in the art is well aware of possible control schemes for controlling the protection circuit elements (110, 125, 225, 260), including related physical and logical designs, details of which are outside the scope of the present application.

Figure 4A:
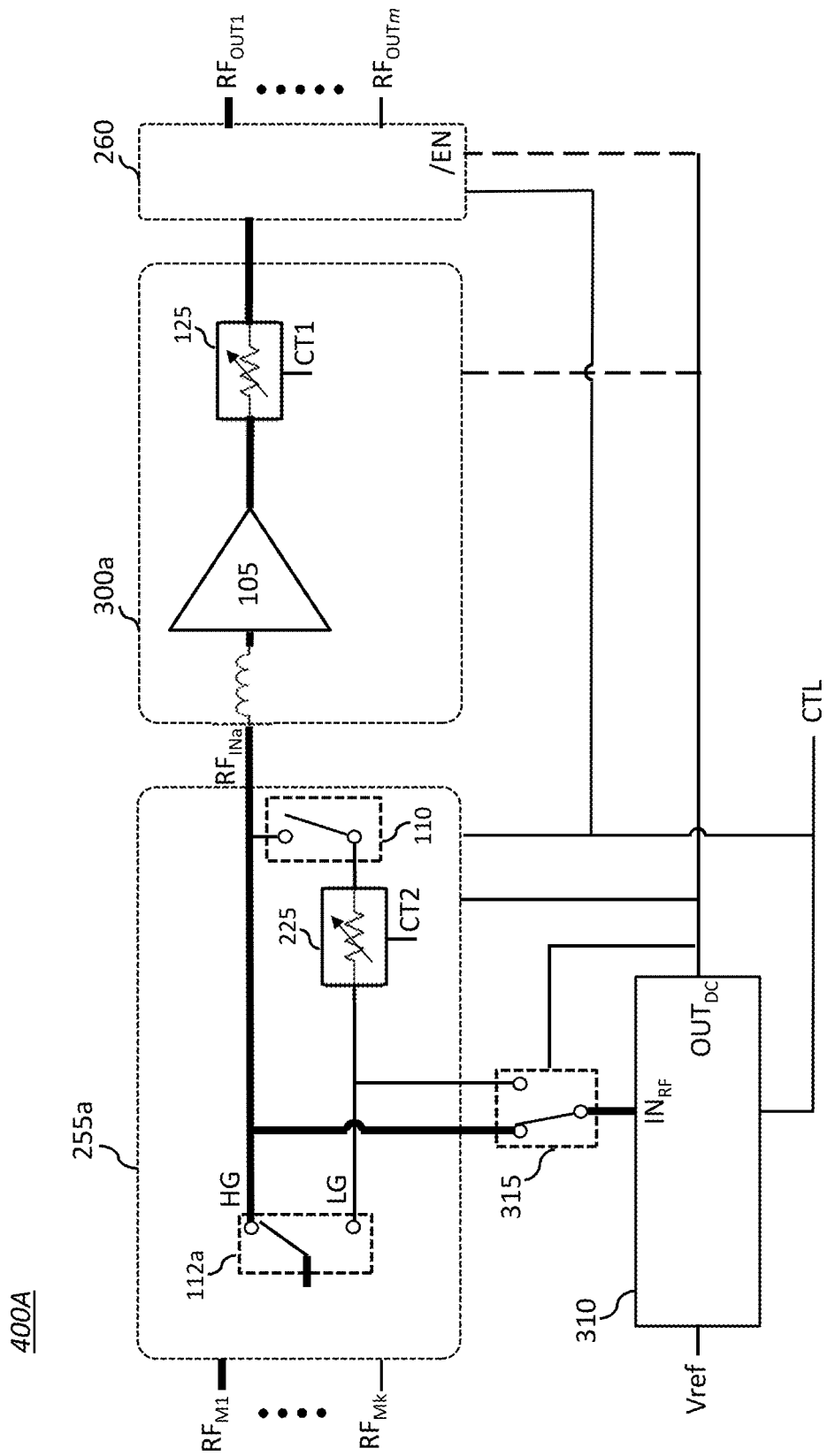
FIG. 4A shows an active RF signal path through the LNA circuit of FIG. 3A according to a mode of operation.

As shown in bold lines in FIG. 4A, during a normal operation wherein a voltage level of an RF signal is below a high voltage level (e.g., below the high trip voltage $V_{HT}$), the RF signal (e.g., $RF_{M1}$ at input of 255a) may flow through an active signal path, in this case the HG path via the input switch (112a), through the amplifier (105), and output at the $RF_{OUT1}$ node of the switch (260). Accordingly, the (input) switch (112a) may couple the input RF signal to the HG path, the switch (110) may decouple the input of the amplifier (105) from the LG path (and attenuator 225), and the attenuator (125) may be programmed for minimal (e.g., reduced) attenuation (e.g., passthrough) of the RF signal processed by the HG path. It should be noted that in contrast to the prior art configuration shown in FIG. 3A wherein the attenuator (125) may be used in combination with the clamp (122) to set a (programmable) clamping voltage level, during normal operation of the attenuator (125) according to the present teachings, such attenuator does not need to provide any level of attenuation and therefore can be programmed to the minimal attenuation supported by the attenuator. As shown in FIG. 4A, during the normal operation, the switch (315) couples the RF signal through the HG path to the RF level detector circuit (310) for monitoring/evaluation/detection of the voltage level of the RF signal. It should be noted that, during the normal operation, an active signal path can include flow of the RF signal through either the HG path (e.g. high gain mode) or the LG path (e.g., low gain mode), wherein the RF level detector circuit (310)

monitors the voltage level of the RF signal in each case based on the setting of the switch (315).

Figure 4B:
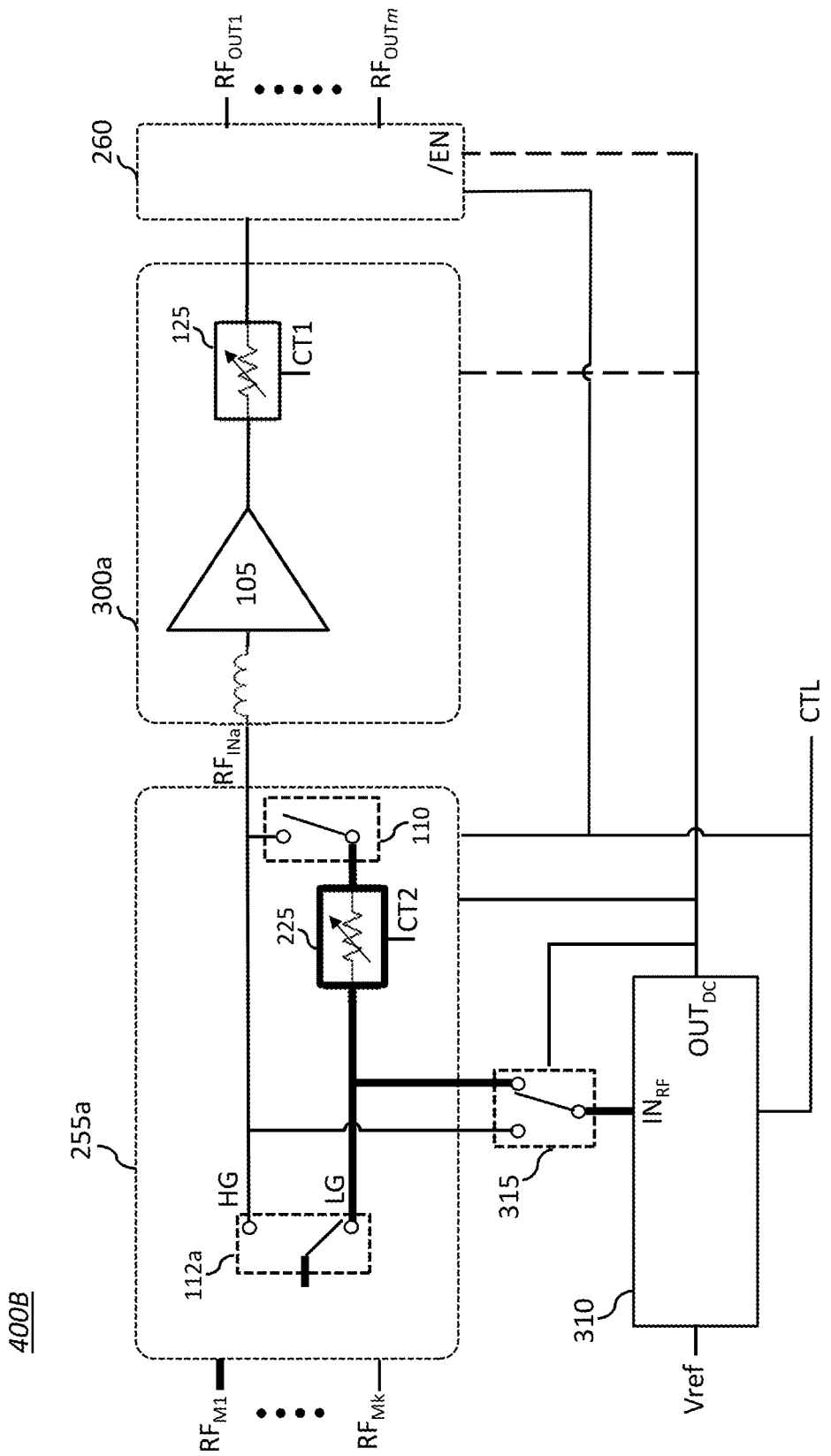
FIG. 4B shows a protection mechanism according to an embodiment of the present disclosure that switches the active RF signal path shown in FIG. 4A to a different RF signal path based on an RF level detected by the programmable RF level detector, the different RF signal path comprising means for attenuating the RF signal before input to the LNA circuit.

FIG. 4B shows a protection mechanism according to an embodiment of the present disclosure wherein the active (RF) signal path, HG path, shown in FIG. 4A is switched to a different RF signal path, the LG path, based on an RF level detected by the programmable RF level detector (310), the different RF signal path, the LG path, comprising means for attenuating (e.g., attenuator 225) the RF signal before input to the LNA circuit (300a) comprising the amplifier (105). Detection of an RF voltage level above the high trip voltage, $V_{HT}$, by the RF level detector circuit (310) may cause such detector to output the $OUT_{DC}$ control signal to: a) force the RF signal to be routed through the LG path that includes the attenuator (225) via for example control of the (input) switch (112a) of the band input switch (255a); and b) control the attenuator (225) to provide a level of attenuation based on for example, configuration data provided to the RF level detector circuit (310) (e.g., via logic circuit block 310D of FIG. 3B), wherein such attenuation is configured to provide a desired level of clamping to the input of the amplifier (105). As shown in FIG. 4B, further increased attenuation may be provided by decoupling the LG path from the input of the amplifier (105) via the switch (110). Furthermore, as shown in FIG. 4B, the switch (315) may be set to couple the input, $IN_{REF}$, of the programmable RF level detector (310) to the LG path where the RF signal flows. Accordingly, the detector (310) can maintain monitoring of the level of the voltage level of the RF signal, and reset the output control, $OUT_{DC}$, to restore the normal operation per the configuration shown in FIG. 4A when an RF voltage level below the low trip voltage, $V_{LT}$, is detected by the RF level detector circuit (310).

Figure 4C:
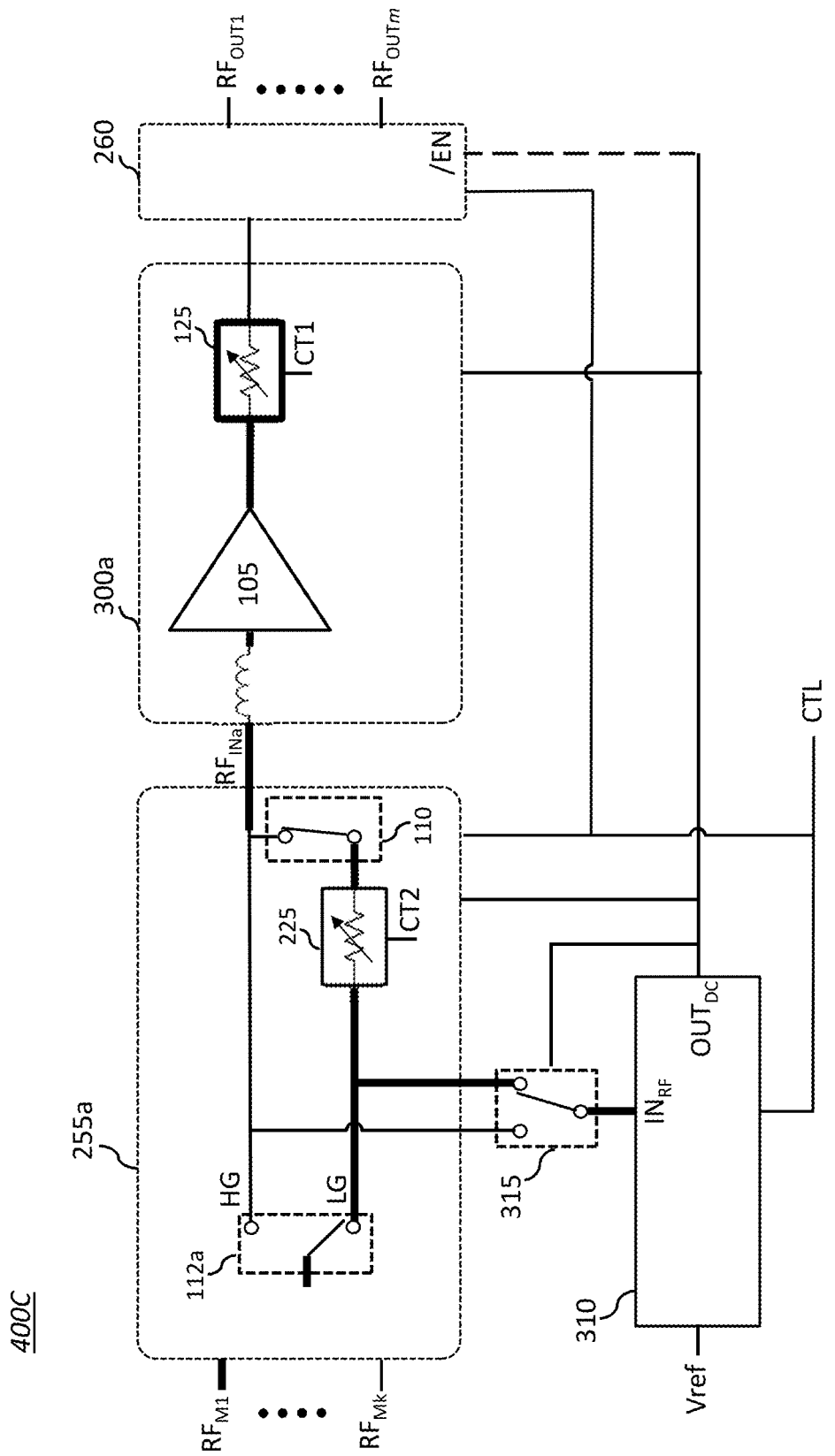
FIG. 4C shows an alternative embodiment according to the present disclosure of the protection mechanism shown in FIG. 4B, wherein the different RF signal path comprises means for attenuating the RF signal at the output of the LNA circuit.

FIG. 4C shows an alternative embodiment according to the present disclosure of the protection mechanism shown in FIG. 4B, wherein the different RF signal path, the LG path, comprises means for attenuating (e.g., attenuator 125) the RF signal at the output of the LNA circuit. In this case, detection of an RF voltage level above the high trip voltage, $V_{HT}$, by the RF level detector circuit (310) may cause such detector to output the $OUT_{DC}$ control signal to: a) force the RF signal to be routed through the LG path that includes the attenuator (225) via for example control of the (input) switch (112a) of the band input switch (255a); and b) control the attenuator (125) to provide a level of attenuation based on for example, configuration data provided to the RF level detector circuit (310) (e.g., via logic circuit block 310D of FIG. 3B), wherein such attenuation is configured to provide a desired level of clamping to the output of the amplifier (105). As shown in FIG. 4C, the attenuator (225) of the LG path may not be controlled based on the RF voltage level detected by the circuit (310) and the switch (110) may be set to couple the RF signal to the amplifier (105). Furthermore, as shown in FIG. 4C, the switch (315) may be set to couple the input, $IN_{RF}$, of the programmable RF level detector (310) to the LG path where the RF signal flows. Accordingly, the detector (310) can maintain monitoring of the level of the voltage level of the RF signal, and reset the output control, $OUT_{DC}$, to restore the normal operation per the configuration shown in FIG. 4A when an RF voltage level below the low trip voltage, $V_{LT}$, is detected by the RF level detector circuit (310).

Figure 4D:
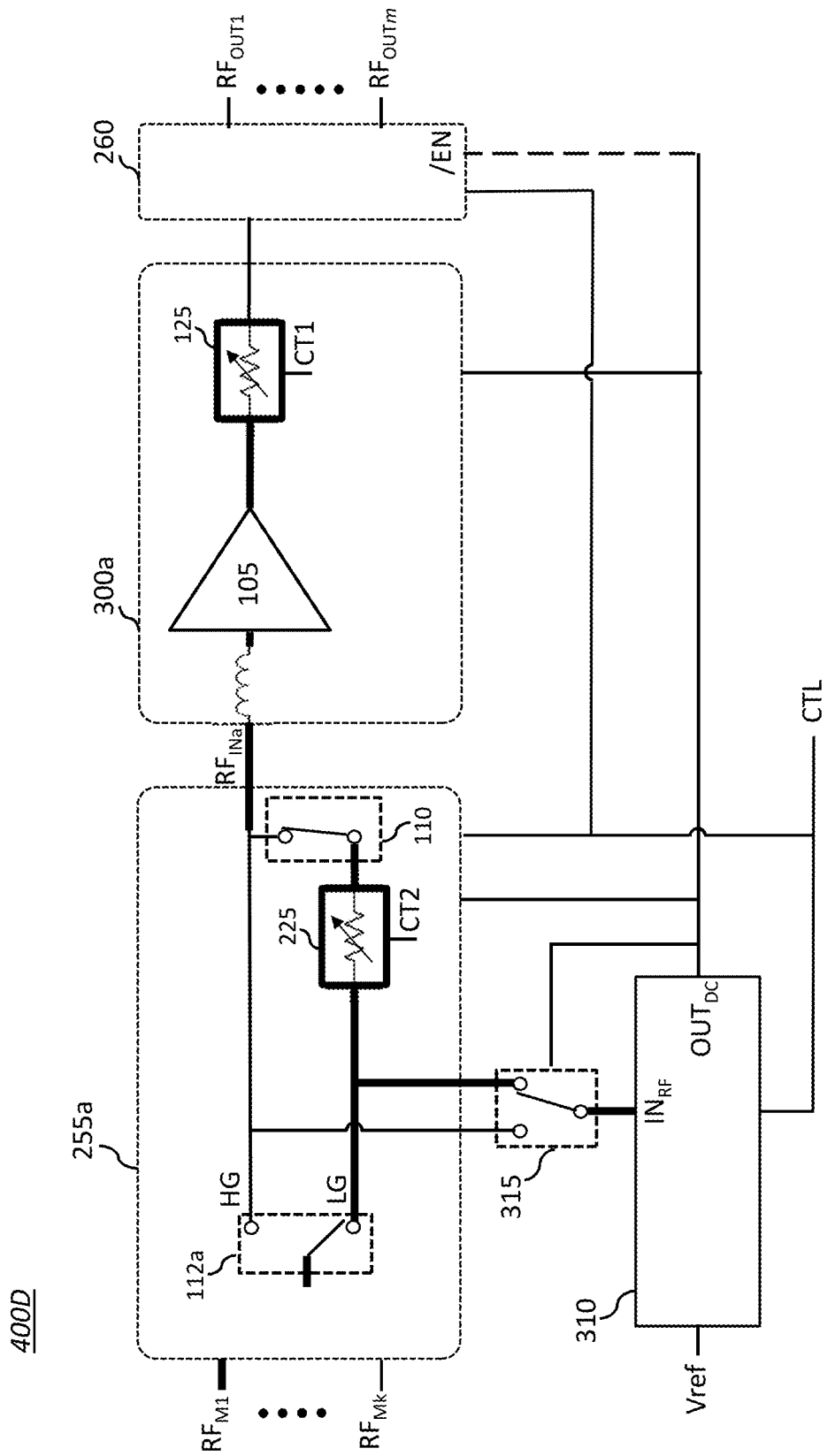
FIG. 4D shows an alternative embodiment according to the present disclosure of the protection mechanism shown in FIG. 4B, wherein the different RF signal path comprises means for attenuating the RF signal at the input and the output of the LNA circuit.

FIG. 4D shows an alternative embodiment according to the present disclosure of the protection mechanism shown in FIG. 4B, wherein the different RF signal path, the LG path, comprises means (e.g., attenuators 125 and 225) for attenuating the RF signal at the input and the output of the LNA circuit. This configuration can be considered as a combination of the configurations shown in FIG. 4B and FIG. 4C. In general, teachings according to the present disclosure provide attenuating (125, 225) and/or isolation (110, 260) means that in combination can be used to protect one or both of the amplifier (105) and downstream active devices/circuits coupled to the output of the amplifier (105). A combination to be used may be different depending on modes of operation and/or integration schemes used. In other words, the exemplary configurations/combinations shown in FIGS. 4A-4G should not be considered as limiting the scope of the present teachings.

Figure 4E:
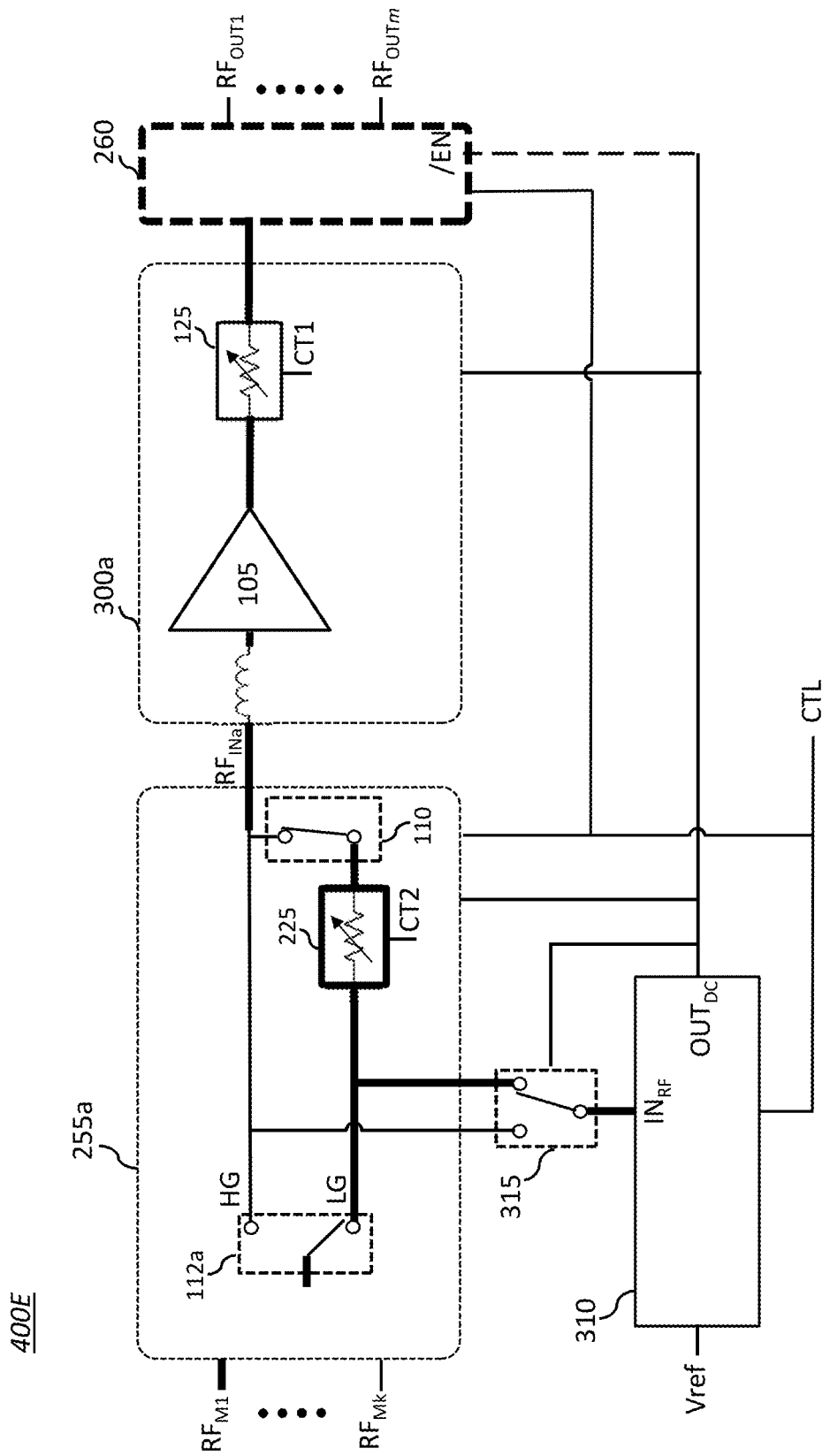
FIG. 4E shows an alternative embodiment according to the present disclosure of the protection mechanism shown in FIG. 4B, wherein the different RF signal path is further isolated from downstream circuits coupled to the output of the LNA circuit via a switch.
Figure 4F:
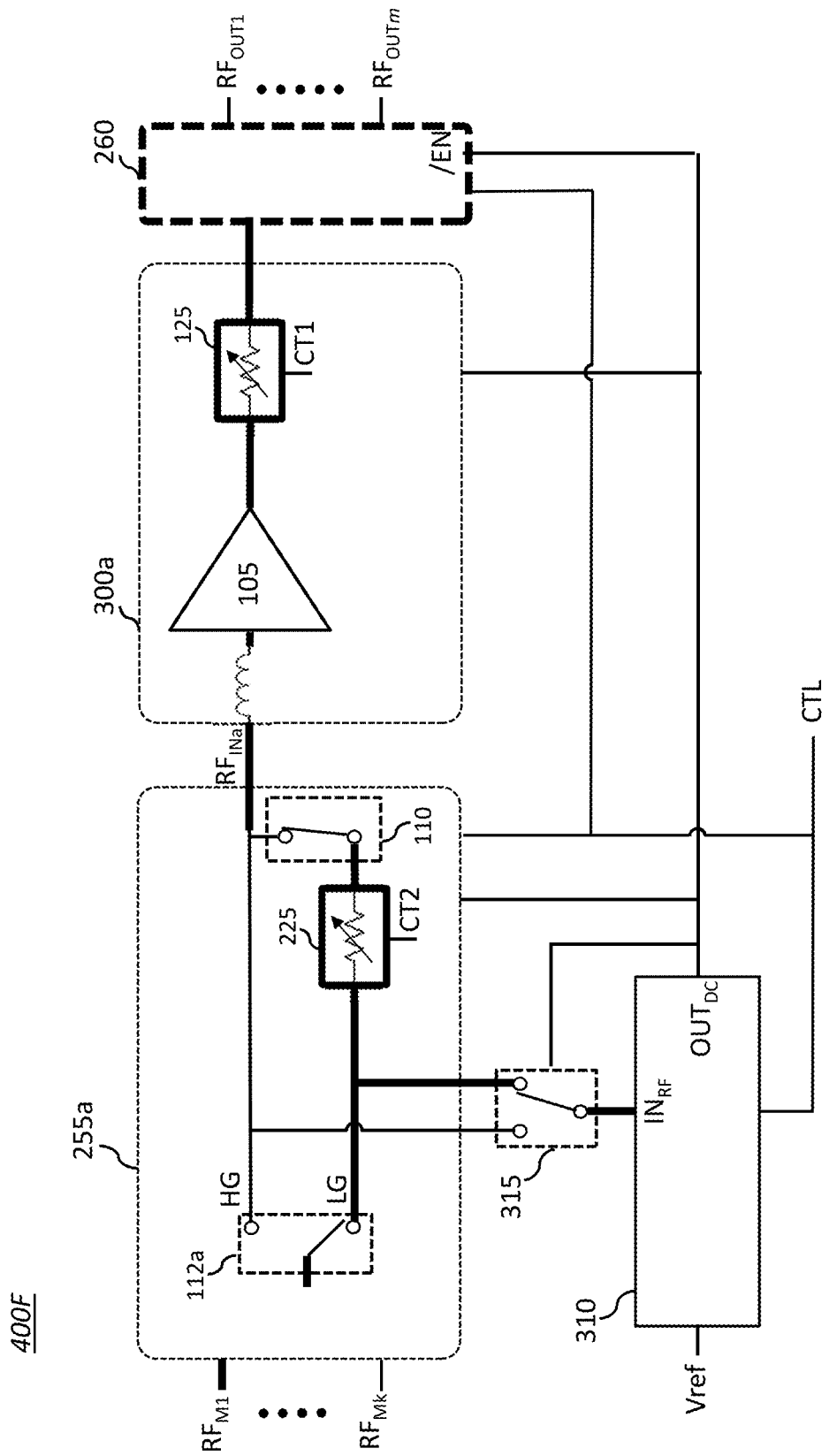
FIG. 4F shows an alternative embodiment according to the present disclosure of the protection mechanism shown in FIG. 4B, wherein the different RF signal path is further isolated from downstream circuits coupled to the output of the LNA circuit via a switch and an attenuator coupled at an output of the LNA circuit.

FIG. 4E shows an alternative embodiment according to the present disclosure of the protection mechanism shown in FIG. 4B, wherein the different RF signal path, the LG path, is further isolated from downstream circuits coupled to the output of the LNA circuit via the switch (260). Although in this exemplary configuration the attenuator (125) is shown as not controlled based on the output $OUT_{DC}$ of the RF level detector circuit (310), according to another exemplary embodiment of the present disclosure, the attenuator (125) may also be controlled, as shown in FIG. 4F. A person skilled in the art would appreciate the teaching according to the present disclosure, wherein elements that are typically used in the switchable RF paths (e.g. LG and HG paths) of an RF front-end stage are reused to operate as protection devices to input and/or outputs of active devices, such as, for example, an amplifier (105) used as an LNA in one or more switchable receive paths of the RF front-end stage.

Although FIG. 4A shows an exemplary mode of operation through the HG path, same configurations shown in FIGS. 4B-4F can be used in a case wherein the mode of operation is through the LG path. A person skilled in the art would understand that in such case, during normal operation wherein the voltage level of the RF signal is below the high trip voltage $V_{HT}$, the attenuator (225) may be programmed to provide an attenuation according to a (low) gain mode of operation, and programmed for an attenuation based on a desired level of clamping when a voltage level of the RF signal is above the high trip voltage $V_{HT}$.

Figure 4G:
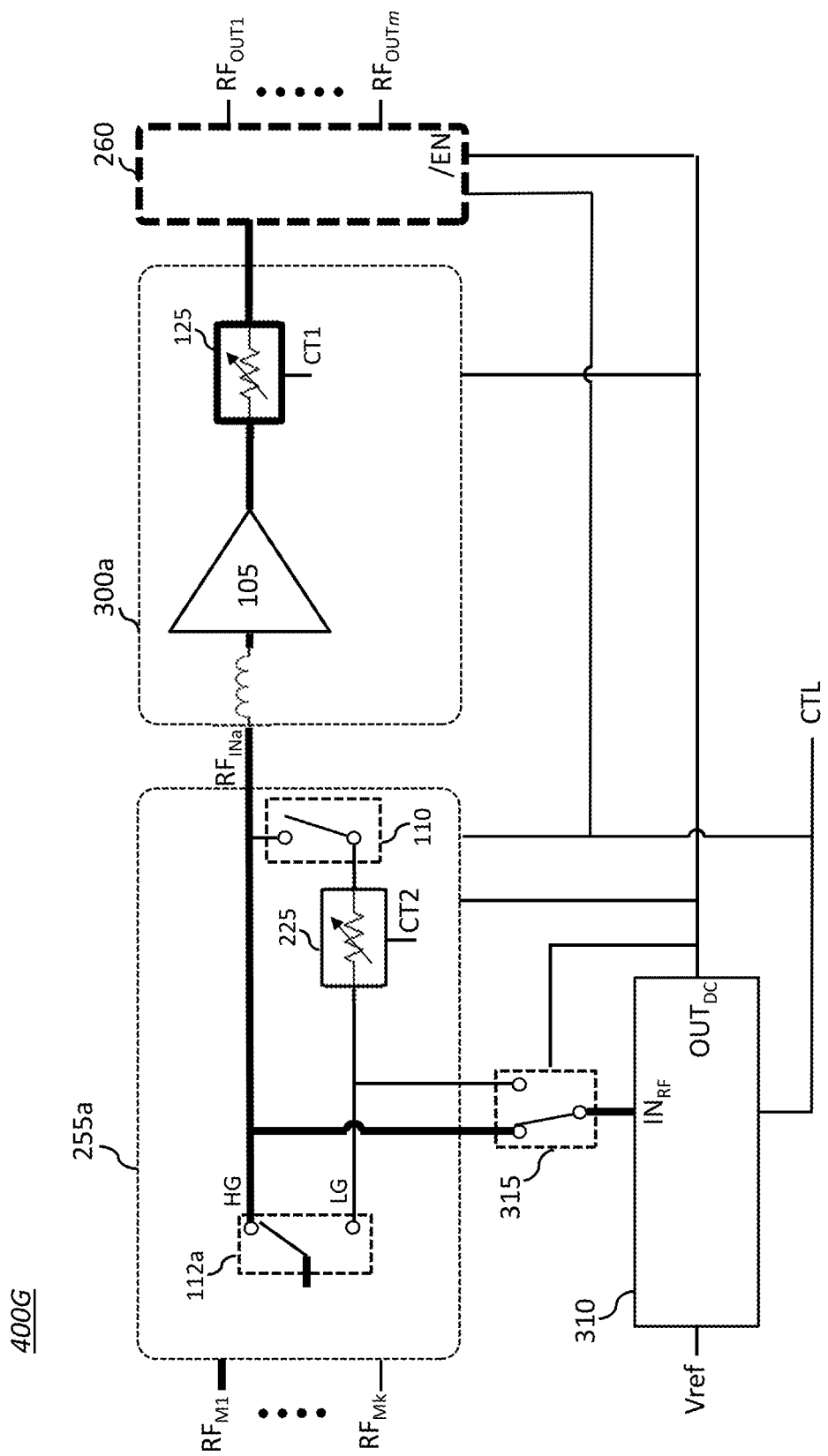
FIG. 4G shows a protection mechanism according to an embodiment of the present disclosure that activates an attenuator and/or a switch coupled to an RF signal path based on an RF level detected by the programmable RF level detector.

Finally, as shown in FIG. 4G, according to an exemplary embodiment of the present disclosure, the active (RF) signal path, HG path shown in FIG. 4A, may be maintained and not switched as described in the embodiments with reference to FIGS. 4B-4F. Instead, as shown in FIG. 4G, upon detection of high value of the RF level, either one or both the attenuator (125) and the output switch (260) can be used to protect downstream circuit coupled to the output of the amplifier (105). For example, for a detected RF level between the reference high trip voltage $V_{HT}$ and a reference low trip voltage $V_{LT}$, the attenuator (125) can be controlled for a higher attenuation level, and for a detected RF level higher than the reference high trip voltage $V_{HT}$, the output switch (260) can be controlled to isolate (decouple) the output of the amplifier (105) from the downstream circuit.

Figure 5A:
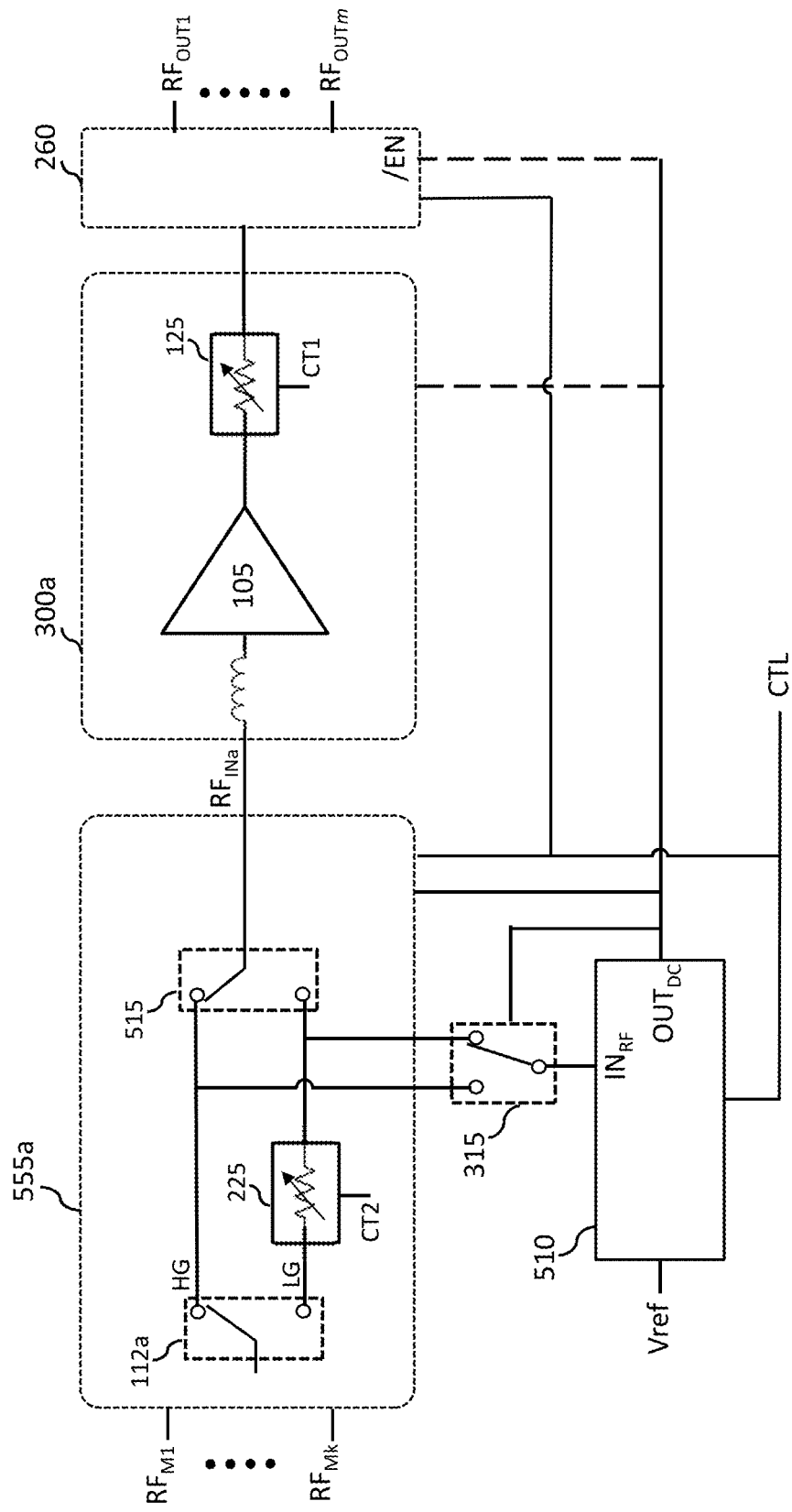
FIG. 5A shows details of switchable RF paths according to another exemplary embodiment of the present disclosure including protection circuit elements coupled to an LNA circuit, the protection circuit elements comprising a single-input programmable RF level detector.

FIG. 5A shows details of switchable RF paths (HG, LG) according to another exemplary embodiment of the present disclosure including protection circuit elements (e.g., 125, 225, 260, 315, 510, 515) coupled to an LNA circuit (300a), the protection circuit elements comprising a single-input programmable RF level detector (510). As can be clearly understood by a person skilled in the art, the configuration shown in FIG. 5A is a variation of the configuration described above with reference to FIG. 3A wherein the RF level detector circuit (510) detects an attenuated version (by the attenuator 225) of the RF signal through the LG path rather than a version of the RF signal before attenuation.

Principle of operation and control of the configuration of FIG. 5A for protection of the LNA circuit (300a) can therefore remain consistent to one described above with reference to FIG. 3A. It should be noted that in the configuration shown in FIG. 5A, the single-pole double-throw SPDT switch (515) can be replaced with the single-throw single pole SPST switch (110) shown in FIG. 3A. Further details of the RF level detector (510), which serves in functionality as the RF level detector circuit (310) described above, are later described with reference to FIGS. 6A, 6B and 6C. It should be noted that the RF level detector (310) may also be used in the configuration shown in FIG. 5A instead of the RF level detector (510).

Figure 5B:
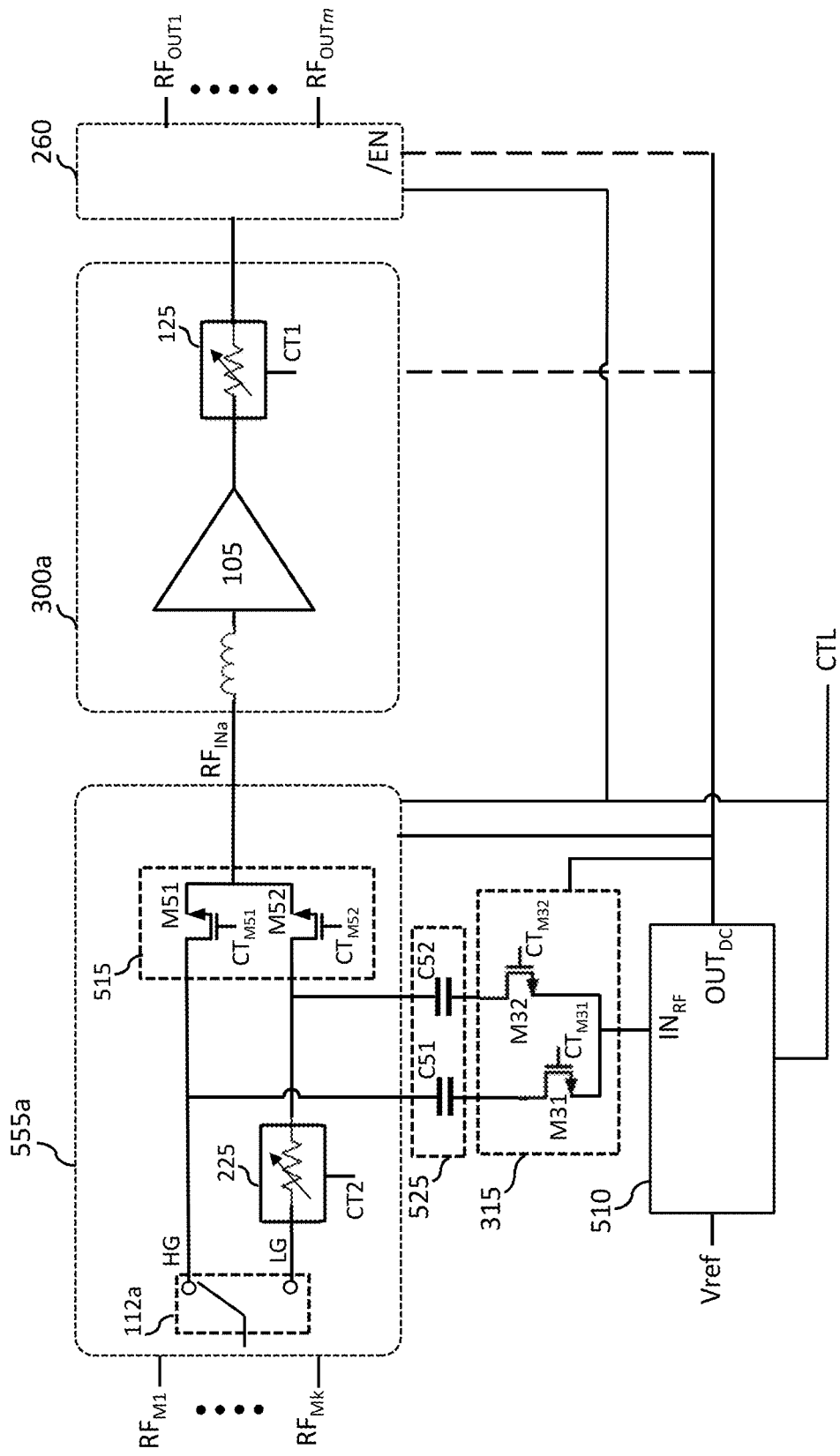
FIG. 5B shows further details of the switchable RF paths shown in FIG. 5A.

FIG. 5B shows further details of the switchable RF paths (HG, LG) shown in FIG. 5A. As shown in FIG. 5B, according to an exemplary embodiment of the present disclosure, the switches (315) and (515) can be transistor switches (M31, M32) and (M51, M52) respectively, controlled by control signals ($CT_{M31}$, $CT_{M32}$) and ($CT_{M51}$, $CT_{M52}$) respectively. It should be noted that although each such transistor switch is symbolically represented by a transistor (e.g., M31, M32, M51, M52) in FIG. 5B, various known in the art switch configurations can use one or more of a combination of series connected transistors and shunting transistors to implement a function of a switch. Some such configurations are described, for example, in the above referenced U.S. Pat. Nos. 7,910,993 and 6,804,502. According to some exemplary embodiments, such switches can be designed to provide a desired level of RF signal isolation when in the open configuration (i.e., OFF state) and a desired (low) impedance when in the closed configuration (i.e., ON state), over a frequency range of operation. In particular, according to an exemplary embodiment of the present disclosure, the level of RF isolation may be selected from a range of 15 dB to 40 dB.

With further reference to FIG. 5B, an RF signal coupling between each of the switchable RF paths HG and LG, and the RF level detector (510) can be based on a coupler (525) arranged between said paths and the switch (315). Such coupler (525) may be designed for a reduced loading effect on the switchable RF paths (HG, LG) while providing a portion of the RF signal with sufficient power (i.e., amplitude) for processing by the RF level detector (510). According to an exemplary embodiment of the present disclosure, the coupled RF signal provided by the coupler (525) may be in a range from −20 dB to −30 dB. According to an exemplary embodiment of the present disclosure, the coupler may include tapping capacitors C51 and C52 coupled to respective throws (e.g., transistors M31, M32) of the switch (315), and sized (i.e., capacitance) to provide a desired coupling level of the RF signal at a frequency range of operation.

Figure 5C:
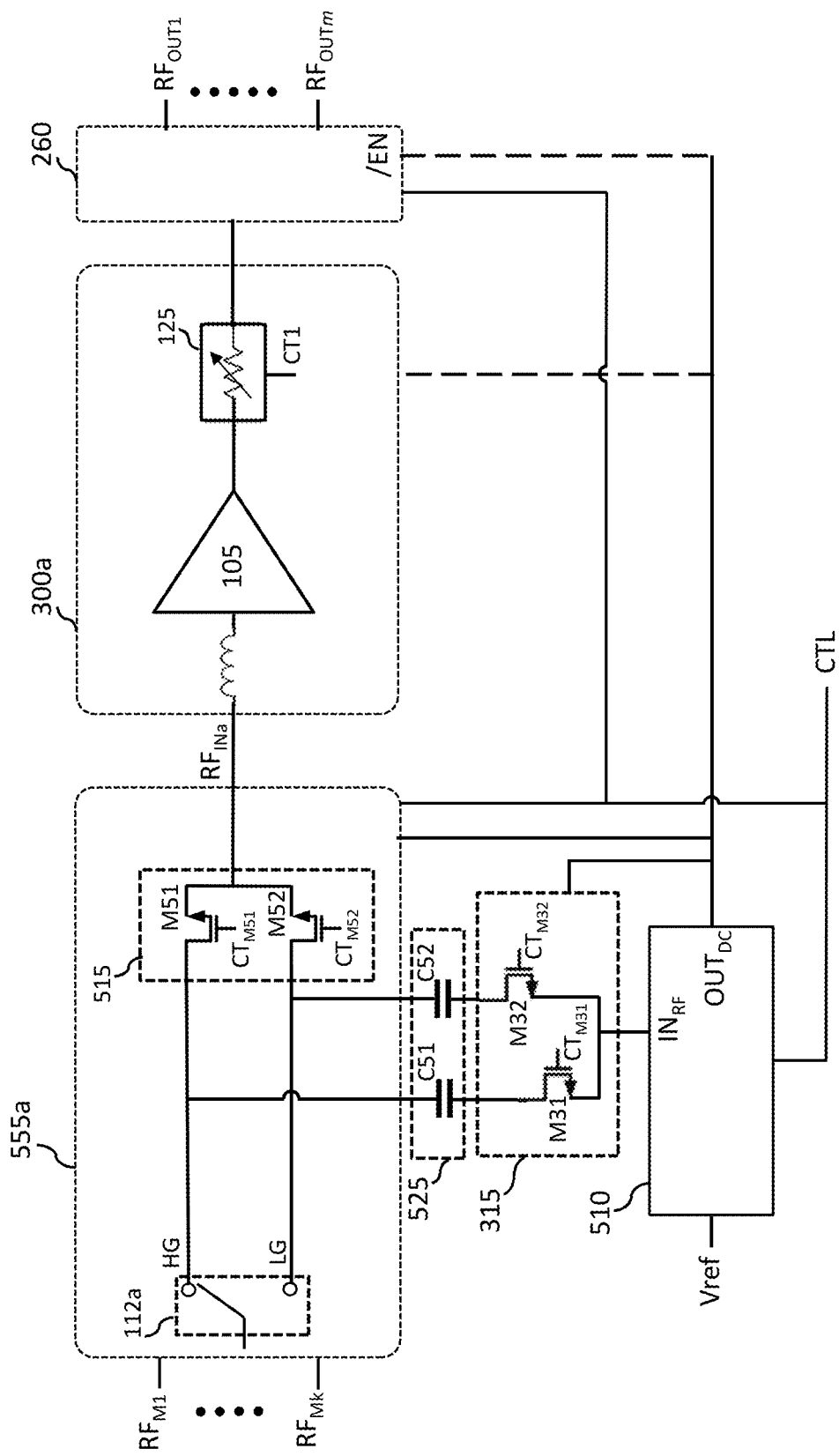
FIG. 5C shows details of switchable RF paths according to yet another exemplary embodiment of the present disclosure based on the embodiment of FIG. 5A.

FIG. 5C shows details of switchable RF paths (HG, LG) according to yet another exemplary embodiment of the present disclosure based on the embodiment of FIG. 5A. In particular, as can be seen in FIG. 5C, the previously provided attenuator (225) in the LG path is removed. Accordingly, protection of the input of the amplifier (105) may be based on a level of isolation provided by the switch (515). For example, if an RF level detected during operation of the HG path is higher than a reference voltage, the transistor switch M51 may be controlled (i.e., via control signal $CT_{M51}$ (which may be generated by the RF level detector 510) to be OFF, thereby providing a reduced RF voltage level to the input of the amplifier (105). According to an exemplary embodiment of the present disclosure, the transistor switch M51 may be designed such that the reduced RF voltage level may be sufficiently high (in view of a high level of the detected RF level) to allow uninterrupted processing of the RF signal by the amplifier (105) while protecting the amplifier. Alternatively, the transistor switch M51 may be designed such that the reduced RF voltage level may be sufficiently low (in view of a high level of the detected RF level) to interrupt processing of the RF signal by the amplifier (105) while protecting the amplifier. Such uninterrupted or interrupted processing can be considered as a design preference. In some exemplary embodiments according to the present disclosure, the transistor switches M51 and M52 may provide a programmable level of isolation based on turning ON and OFF different series and shunting stages of such switches for more of less isolation. As can be clearly understood by a person skilled in the art, protection of the input of the amplifier (105) during operation of the HG path may be based on turning the switch M51 from the ON state to the OFF state while maintaining the switch M52 in the OFF state, and protection of the input of the amplifier (105) during operation of the LG path may be based on turning the switch M52 from the ON state to the OFF state while maintaining the switch M51 in the OFF state. Furthermore, it should be noted that same principle of operation described with respect to the configuration of FIG. 5C can be applied to the configuration of FIG. 5B, in other words, protection of the input of the amplifier (105) shown in FIG. 5B may be provided via the transistor switches M51 and M52 and without forcing the RF signal through the LG path as described above.

Figure 5D:
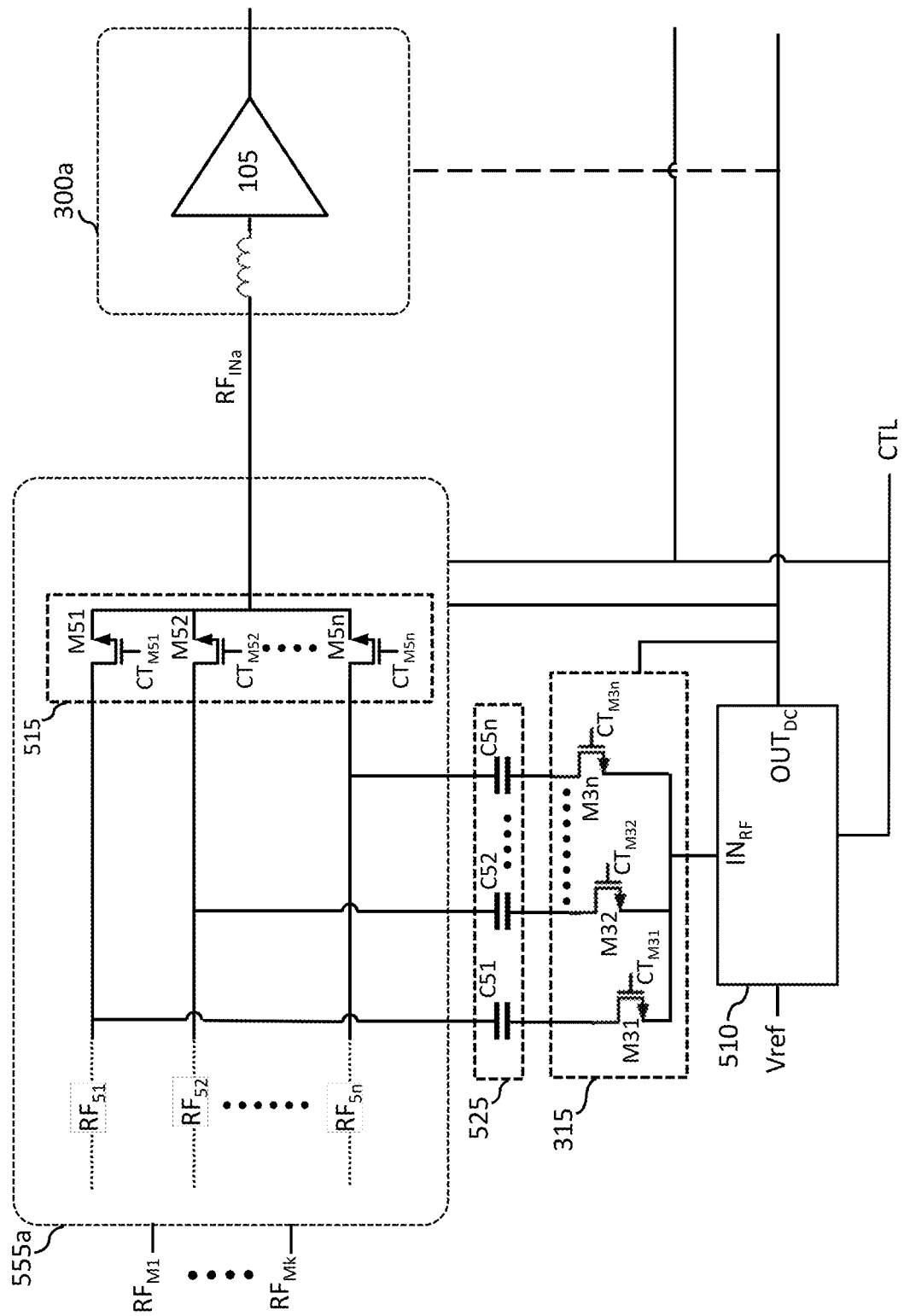
FIG. 5D shows a configuration according to the embodiment of FIG. 5C expanded for a plurality of switchable RF paths.

FIG. 5D shows a configuration according to the embodiment of FIG. 5C expanded for a plurality of switchable RF paths ($RF_{51}$, $RF_{52}$, ..., $RF_{5n}$). As can be seen in FIG. 5D, each such RF path may be selectively coupled to the input of the amplifier (105) via a corresponding transistor switch (M51, M52, ..., M5n) respectively controlled by control signals ($CT_{M51}$, $CT_{M52}$, ..., $CT_{M5n}$), and selectively coupled to the RF level detector circuit (510) via respective tapping capacitors (C51, C52, ..., C5n) of a coupler (525) and through a transistor switch (M31, M32, ..., M3n) respectively controlled by control signals ($CT_{M31}$, $CT_{M32}$, ..., $CT_{M3n}$). It should be noted that the control signals ($CT_{M31}$, $CT_{M32}$, ..., $CT_{M3n}$) may be generated by a signal aware controller such as, for example, a transceiver module, to establish activation of one of the switchable RF paths. As can be clearly understood by a person skilled in the art, protection of the input of the amplifier (105) during operation of a path $RF_{5k}$, for k=1, 2, ..., n, may be based on turning the switch M5k from the ON state to the OFF state while maintaining all the other switches M5p, p=1, 2, ..., k−1, k+1, ..., n, in the OFF state.

Figure 5E:
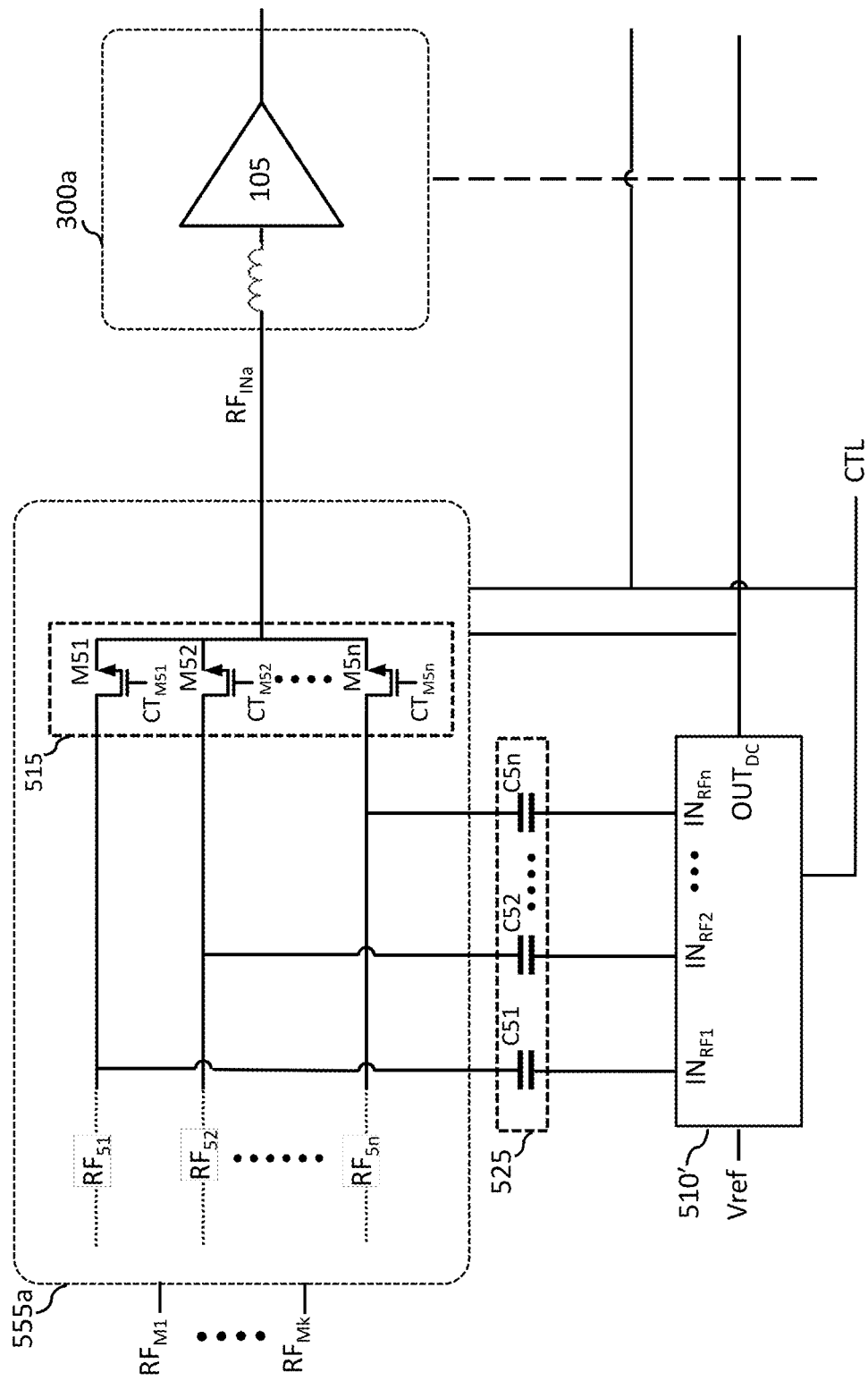
FIG. 5E shows details of switchable RF paths according to yet another exemplary embodiment of the present disclosure including protection circuit elements coupled to an LNA circuit, the protection circuit elements comprising a multi-input programmable RF level detector.

FIG. 5E shows details of switchable RF paths ($RF_{51}$, $RF_{52}$, ..., $RF_{5n}$) according to yet another exemplary embodiment of the present disclosure including protection circuit elements (510', 515) coupled to an input of an LNA circuit (300a), the protection circuit elements comprising a multi-input programmable RF level detector (510'). Principle of operation of the configuration shown in FIG. 5E is similar to one described above with reference to FIG. 5D with a difference that the switch (315) shown in FIG. 5D is omitted due to the multi-input capability of the RF level detector (510'). In other words, the multi-input programmable RF level detector (510') can independently detect an RF level of each of the switchable RF paths ($RF_{51}$, $RF_{52}$, ..., $RF_{5n}$) through the coupling (525). As later described with reference to FIG. 7A, this multi-input functionality is provided via provision within the RF level detector (510') of separate RF detectors for each of the switchable RF paths ($RF_{51}$, $RF_{52}$, ..., $RF_{5n}$).

Figure 6A:
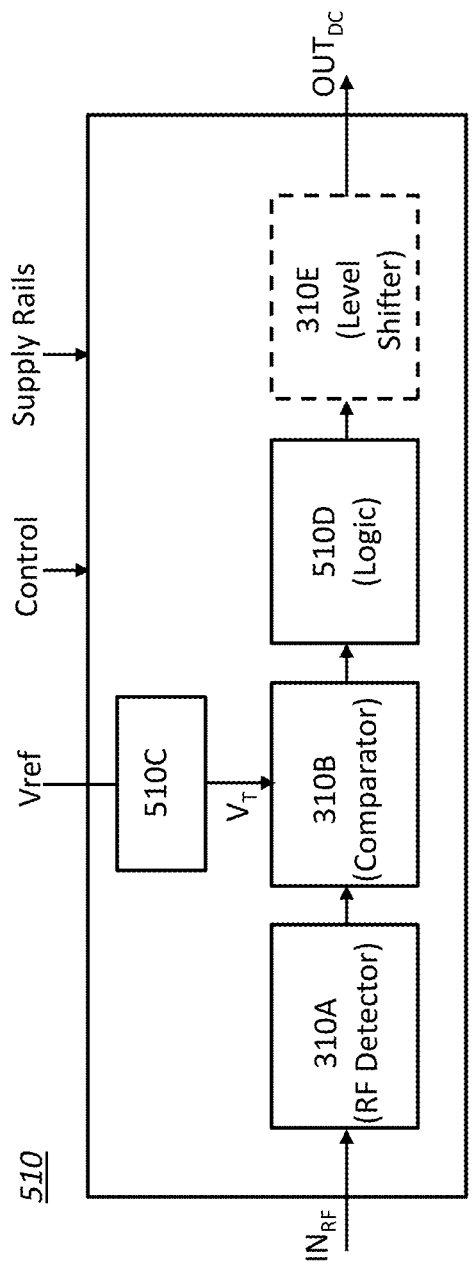
FIG. 6A shows a simplified block diagram according to an embodiment of the present disclosure of the single-input programmable RF level detector shown in FIG. 5A.

FIG. 6A shows a simplified block diagram according to an exemplary embodiment of the present disclosure of the single-input programmable RF level detector (510) shown in FIG. 5A. As can be clearly understood by a person skilled in the art, the single-input programmable RF level detector (510) includes blocks with same functionality as blocks of the RF level detector (310) described above with reference to FIG. 3B. Main difference between the two blocks being a difference in operation of the comparator circuit block (310B) which in the case of the RF level detector (510) trips based on a single reference trip voltage $V_T$, as opposed to the reference high trip voltage $V_{HT}$ and the reference low trip voltage $V_{LT}$ described above with reference to FIG. 3B. Accordingly, the trip voltage generator circuit block (510c) shown in FIG. 6A can be implemented as shown in FIG. 6B, which is a simplified version of the circuit described above with reference to FIG. 3E. As can be clearly understood by a person skilled in the art, the circuit block (510C) shown in FIG. 6B generates the reference trip voltage $V_T$, based on a reference voltage, Vref, provided to a resistive ladder network (R32, R33, R34) that operates as a (programmable) voltage divider. Furthermore, as shown in FIG. 6A, the level shifter circuit block (310E) may be optional, as the logic circuit block (510D) may be able to directly drive/control switching elements (515). Finally, as previously described, the programmable RF level detector (310) described above with reference to FIG. 3B may be used in the above embodiments in lieu of the programmable RF level detector (510).

Figure 6C:
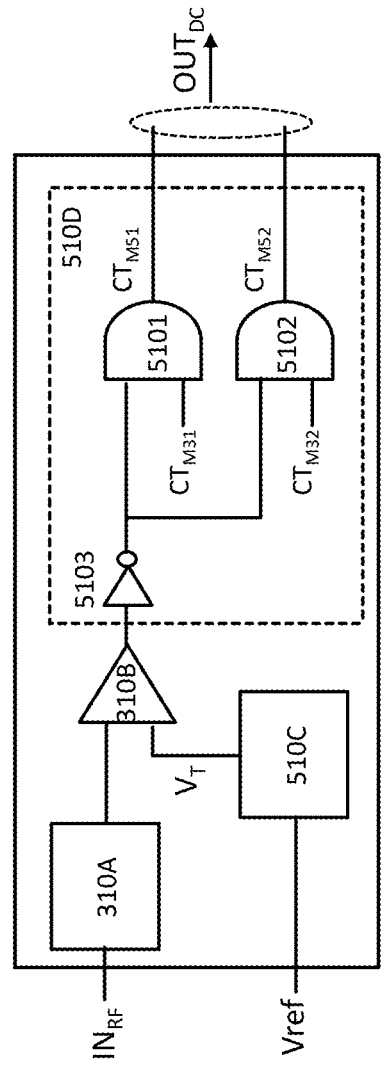
FIG. 6C shows further details of the single-input programmable RF level detector of FIG. 6A including details of an exemplary logic circuit.
Figure 6B:
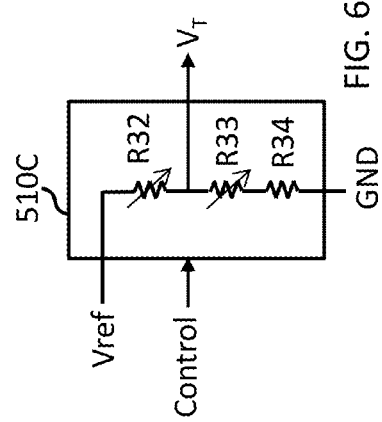
FIG. 6B shows an exemplary circuit according to an embodiment of the present disclosure for providing a reference voltage to a comparator used in the single-input programmable RF level detector of FIG. 5A.

FIG. 6C shows further details of the single-input programmable RF level detector (510) of FIG. 5A, including details of an exemplary implementation of the logic circuit block (510D). As shown in FIG. 6C, the logic circuit block (510D) may include an inverter (5103) coupled to an output of the comparator (310b), the inverter (5103) coupled at its output to respective first inputs of logic AND gates (5101) and (5102). Respective second inputs of the logic AND gates (5101) and (5102) being provided control signals $CT_{M31}$ and $CT_{M32}$ that are used to control state of the transistor switches M31 and M32 described above. As can be clearly understood by a person skilled in the art, during operation, only one of the control signals $CT_{M31}$ and $CT_{M32}$ is active and indicative of a switchable RF path coupled to the programmable RF level detector (510). For example, when the control signal $CT_{M31}$ is active (e.g., high level), the input, $IN_{RF}$, to the RF level detector (510) is a coupled RF signal from the switchable RF path HG, and when the control signal $CT_{M32}$ is active (e.g., high level), the input, $IN_{RF}$, to the RF level detector (510) is a coupled RF signal from the switchable RF path LG.

With continued reference to FIG. 6C, considering the exemplary case when the control signal $CT_{M31}$ is active (e.g., high level) and therefore the control signal $CT_{M32}$ is inactive (e.g., low level), then the RF level detector (510) detects a level of the RF signal through the HG path. If a detected level is lower than the reference trip voltage, $V_T$, then the comparator (310B) does not trip and its output state remains low. The inverter (5103) inverts the output state of the comparator (310B) and presents a high level at the second input of the logic AND gates (5101) and (5102). Because the first input of the logic AND gate (5101) is high and the first input of the logic AND gate (5102) is low, then the output of the logic AND gate (5101) is high and the output of the logic AND gate (5102) is low. Accordingly, the transistor switch M51 is controlled to be ON and the transistor switch M52 is controlled to be OFF. On the other hand, if a detected level is higher than the reference trip voltage, $V_T$, then the comparator (310B) does trips and its output state changes to high. The inverter (5103) inverts the output state of the comparator (310B) and presents a low level at the second input of the logic AND gates (5101) and (5102). Because the second input of the logic AND gate (5101) is low and the first input of the logic AND gate (5102) is low, then the output of the logic AND gate (5101) switches to low and the output of the logic AND gate (5102) remains low. Accordingly, the transistor switch M51 is controlled to be OFF and the transistor switch M52 is controlled to remain OFF.

A person skilled in the art would clearly understand that the configuration shown in FIG. 6C with respect to two switchable RF paths (e.g., HG and LG of FIGS. 5B and 5C, can be expanded to support a configuration with higher number of switchable RF paths as shown, for example, in FIG. 5D. Furthermore, it should be noted that a person skilled in the art would know of other design examples for implementing a same functionality as the exemplary logic circuit block (510D) described herein with reference to FIG. 6C. In particular, such other designs may use intermediate logic levels and logic gates that are different from ones described with reference to FIG. 6C. Finally, it should be noted that the output of the logic AND gates (5101) and (5102) shown in FIG. 6C can each be a single signal line that can be considered as part of the output, $OUT_{DC}$, of the programmable RF level detector circuit (510).

Figure 7A:
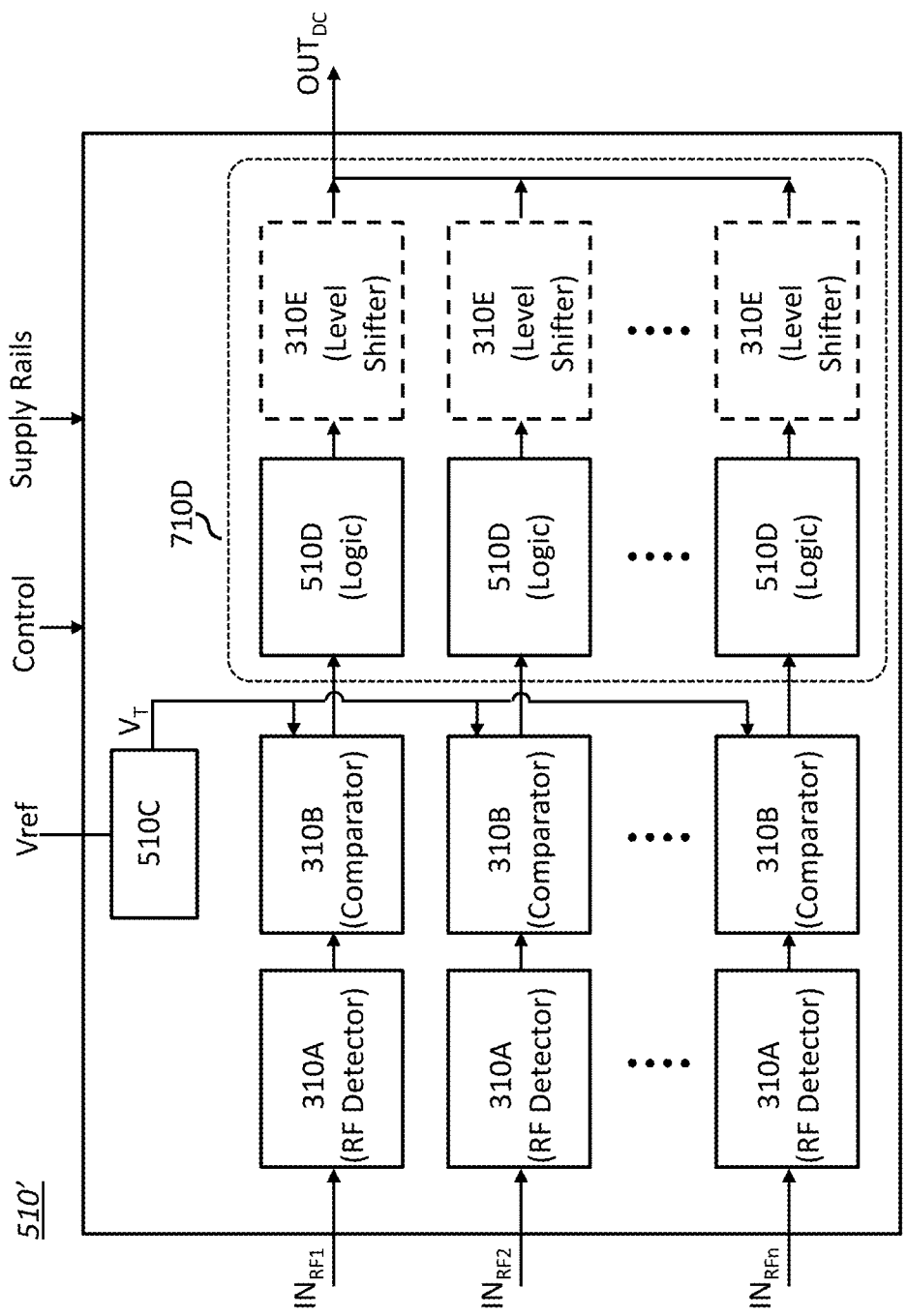
FIG. 7A shows a simplified block diagram according to an embodiment of the present disclosure of the multi-input programmable RF level detector shown in FIG. 5E.

FIG. 7A shows a simplified block diagram according to an embodiment of the present disclosure of the multi-input programmable RF level detector (510') shown in FIG. 5E. As can be seen in FIG. 7A, the RF level detector (510') includes, for each of the input signals ($IN_{RF1}$, $IN_{RF2}$, ..., $IN_{RFn}$) associated processing blocks (310A, 310B, 510D, 310E) similar to one described above with reference to FIG. 6A, and one single circuit block (510C) to generate the reference trip voltage, $V_T$. Because the reference trip voltage, $V_T$, can be programmable, and because only one of the plurality of input signals ON ($IN_{RF1}$, $IN_{RF2}$, ..., $IN_{RFn}$) is processed by the RF level detector (510') at a given time, then the shared configuration of the single circuit block (510C) per FIG. 7A can be possible. According to an alternative embodiment of the present disclosure, the associated processing blocks to each of the input RF signals ($IN_{RF1}$, $IN_{RF2}$, ..., $IN_{RFn}$) can include a dedicated circuit block (510C) (not shown in the figure).

Figure 7B:
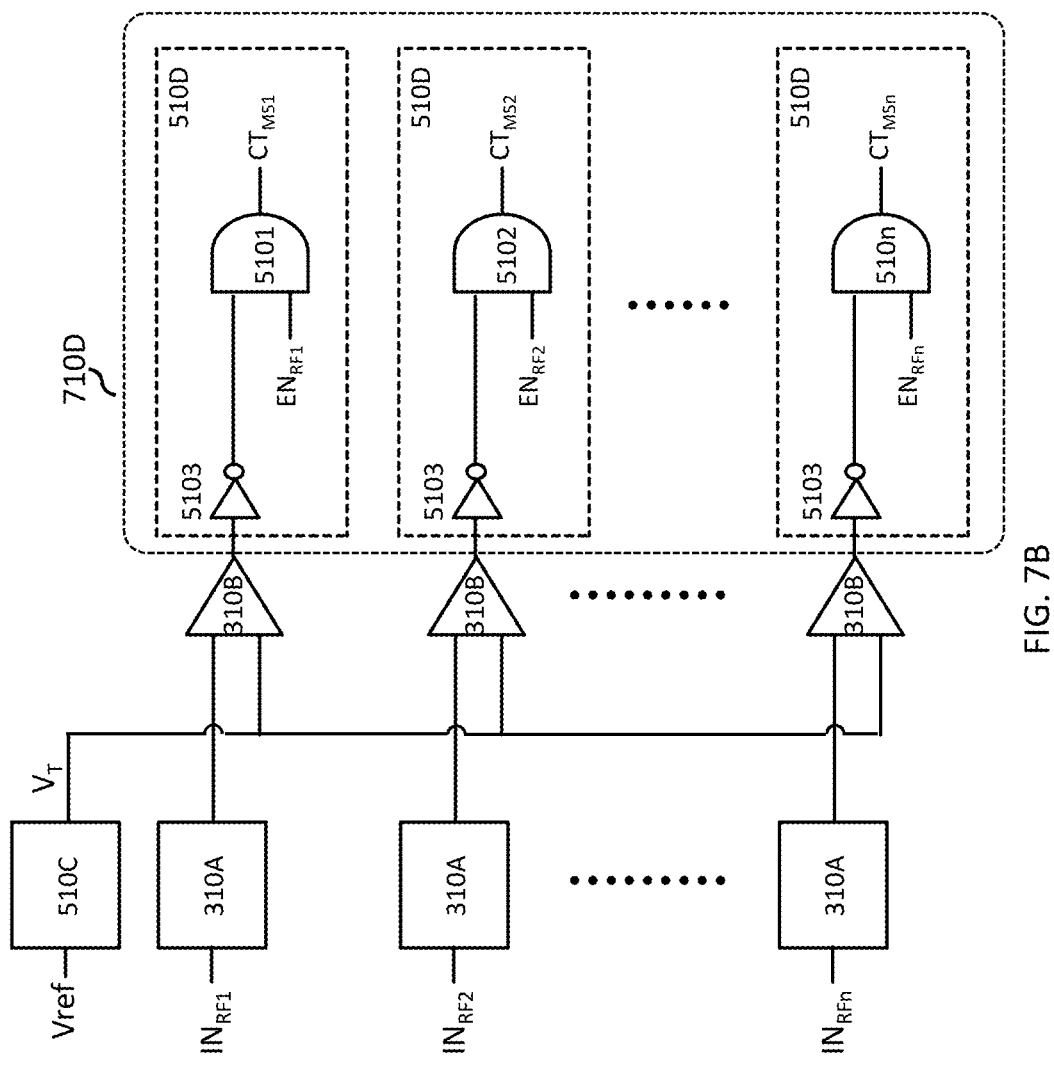
FIG. 7B shows further details of the multi-input programmable RF level detector of FIG. 7A including details of an exemplary logic circuit.

FIG. 7B shows further details of the multi-input programmable RF level detector (510') of FIG. 7A including details of an exemplary logic circuit (710D). A person skilled in the art would clearly understand that operating principle of the RF level detector (510') can be taken from the above description of RF level detector (510) shown in FIG. 6C. In particular, for a case of an active switchable RF path, same logic for controlling a corresponding transistor switch (M51, M52, ..., M5n) can be applied. It should be noted that in FIG. 7B, input signals to respective second inputs of the logic AND gates (5101, 5102, ..., 510n) are labelled as ($EN_{RF1}$, $EN_{RF2}$, ..., $EN_{RFn}$) which as described above represent enabling control signals to the plurality of switchable RF paths, which therefore have same function as the control signals ($CT_{M31}$, $CT_{M32}$, ..., $CT_{M3n}$) described above with reference to, for example, FIG. 5B-5D. Furthermore, as in the case described above with reference to FIG. 6C, dedicated circuit blocks (510C) may be used in lieu of the single shared block shown in FIG. 7A-7B.

Figure 8A:
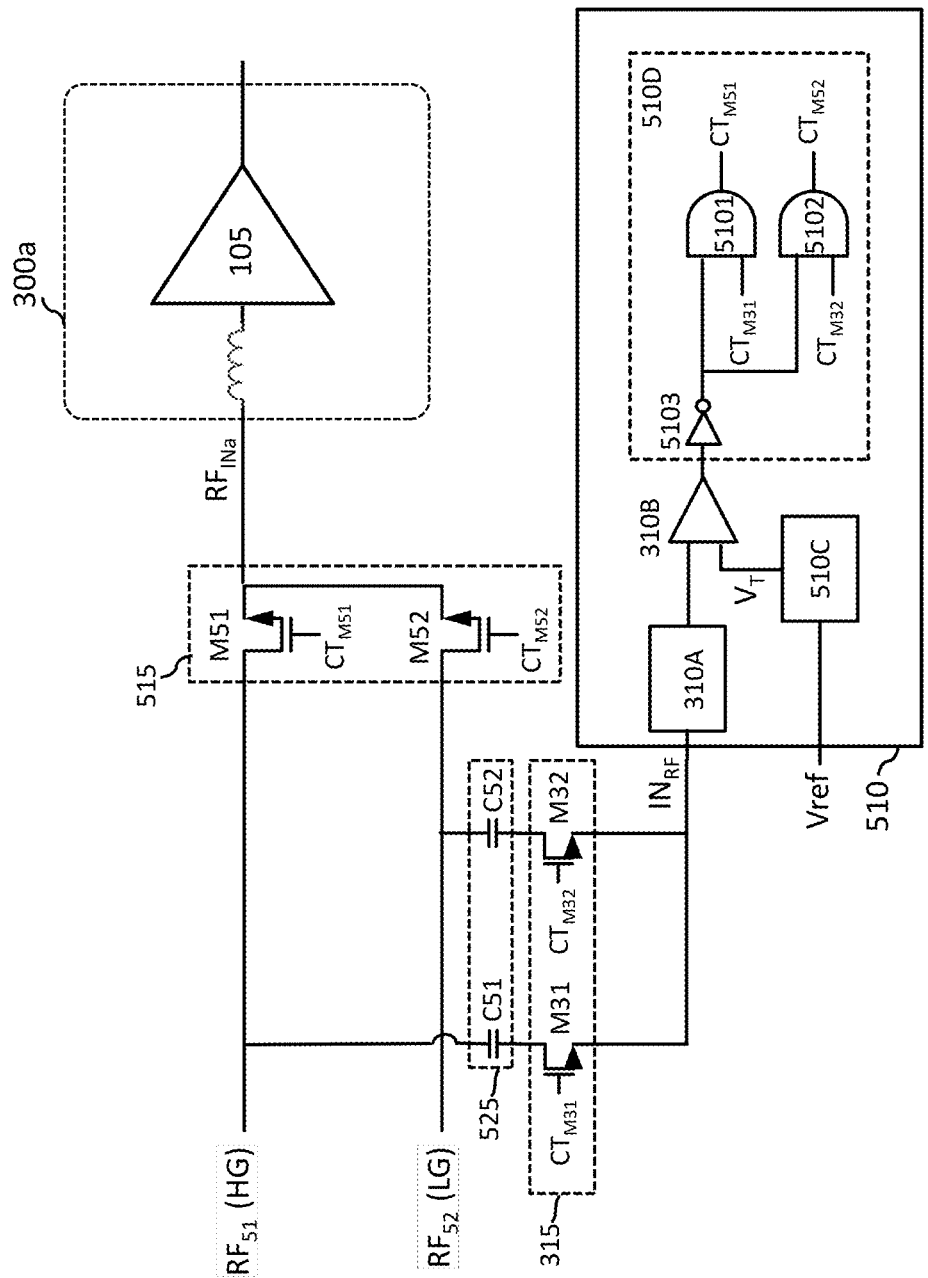
FIG. 8A shows an exemplary embodiment of the configuration shown in FIG. 5C and FIG. 5D including the single-input programmable RF level detector of FIG. 6C.

FIG. 8A shows an exemplary embodiment of the configuration shown in FIG. 5C and FIG. 5D including the single-input programmable RF level detector (510) of FIG. 6C. As described above, although FIG. 8A shows two switchable RF paths, such configuration can be readily expanded to any number of switchable RF paths beyond two.

Figure 8B:
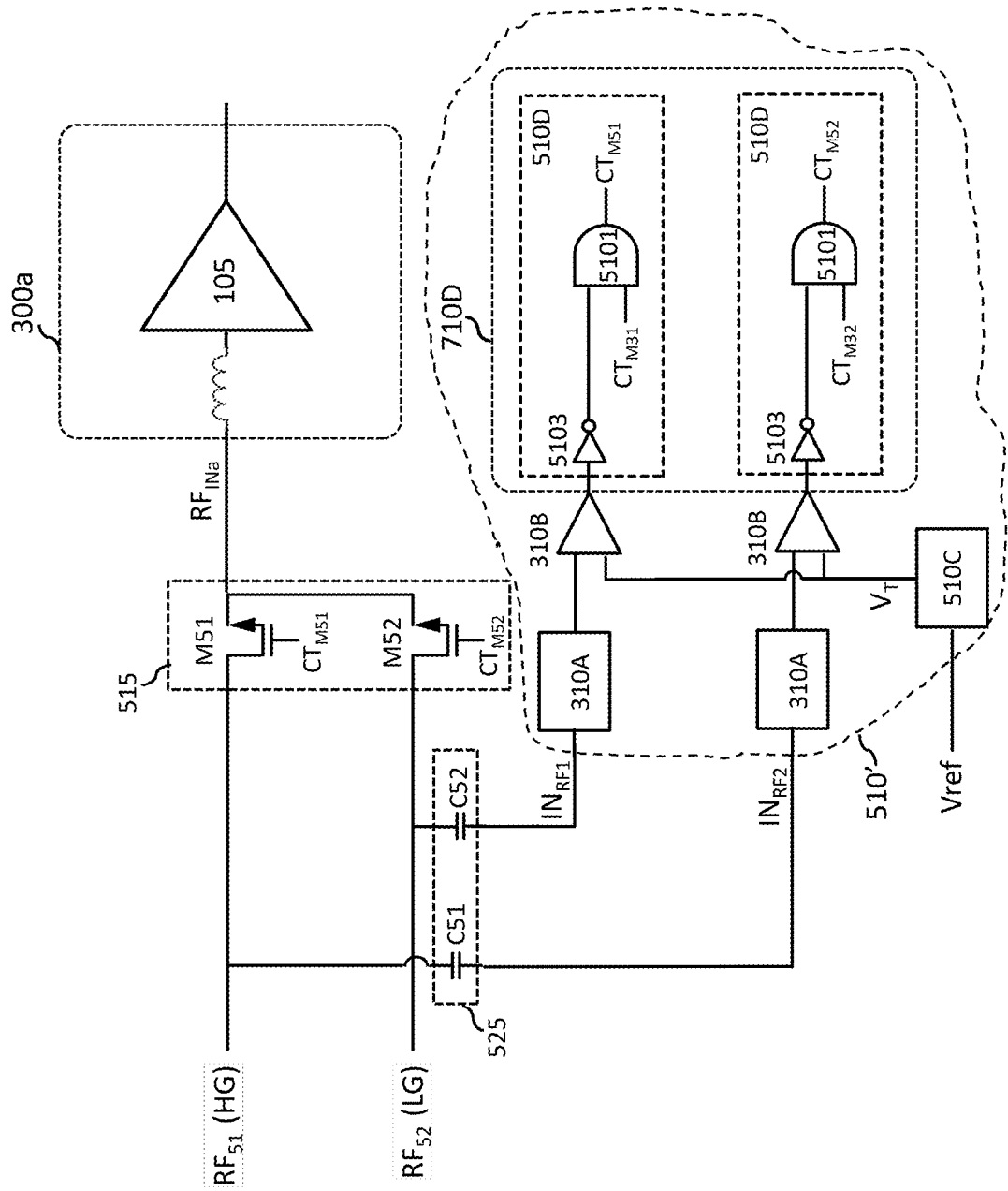
FIG. 8B shows an exemplary embodiment of the configuration shown in FIG. 5E including the multi-input programmable RF level detector of FIG. 7B.

FIG. 8B shows an exemplary embodiment of the configuration shown in FIG. 5E including the multi-input programmable RF level detector (510') of FIG. 7B. As described above, although FIG. 8A shows two switchable RF paths, such configuration can be readily expanded to any number of switchable RF paths beyond two.

FIG. 9A shows an exemplary multi-stage cascode amplifier (900a) that can be used as the amplifier (105) described with reference to the figures of the present application. As known to a person skilled in the art, such amplifier includes an input transistor T1, and one or more cascode transistors (T2, ..., Tn), including an output cascode transistor, Tn. An input RF signal, $RF_{INa}$, fed to a gate of the input transistor, T1, is amplified by the amplifier (900a) and output at a drain of the output transistor, Tn, as an output RF signal, $RF_{OUT}$. The series connected transistors (T1, T2, ..., Tn) operate between a reference AC ground, GND, and a supply voltage, $V_{DD}$. DC decoupling capacitors $C_{IN}$ and $C_{OUT}$, respectively coupled at the input and output of the amplifier allow removal/decoupling of DC biasing voltages present within the amplifier from the $RF_{IN}$ and $RF_{OUT}$ signals. Biasing voltages ($V_{BIAS1}$, $V_{BIAS2}$, ..., $V_{BIASn}$) to gates of respective transistors (T1, T2, ..., Tn) can be used to set operating points/conditions of such transistors according to techniques and methods well known in the art. In some cases (e.g., power amplifier), gate capacitors ($C_{G2}$, ..., $C_{Gn}$) coupled between gates of respective cascode transistors (T2, ..., Tn) and the reference AC ground, GND, may allow coupling of RF signals at sources of respective transistors to the gates, so to control distribution of the RF voltage across the transistors (T1, T2, ..., Tn) according to techniques and methods well known in the art. In other cases (e.g., LNA), the gate capacitors ($C_{G2}$, ..., $C_{Gn}$) may simply short the gates to the AC ground, GND, at frequencies of operation. Finally, optional degeneration inductor, $L_{DEG}$, and optional input inductor, $L_{IN}$, may be used to further control gain of the amplifier (900a).

It should be noted that the devices and methods for protecting an amplifier according to the present teachings described above may not be limited to protecting an amplifier (e.g., LNA or power amplifier, such as for example, multi-stage cascode amplifier (900a) of FIG. 9A), rather such devices and methods may be used to protect any active or passive RF device susceptible to be damaged by high input RF voltages. Accordingly, devices and methods according to the present teachings can be used to protect the active RF device shown in FIG. 9B and the passive RF device shown in FIG. 9C whether coupled to a single RF path or a plurality of switchable RF paths. As well known to a person skilled in the art, an active (RF) device may be considered as a device that is powered by an external voltage or current source and include and active element (e.g., transistor that can amplify a current), whereas a passive device may be considered as a device that may not require an external power source, and therefore operates solely with passive devices (e.g., resistive, capacitive, inductive). According to an exemplary embodiment of the present disclosure, the described protection circuit elements may be used to protect input of a surface acoustic wave (SAW) filter. In such case, the configuration of, for example, FIG. 5E, reduced to any number of RF paths may be used (while replacing the device (300a) with the SAW filter in the block diagram of FIG. 9C).

Figure 10:
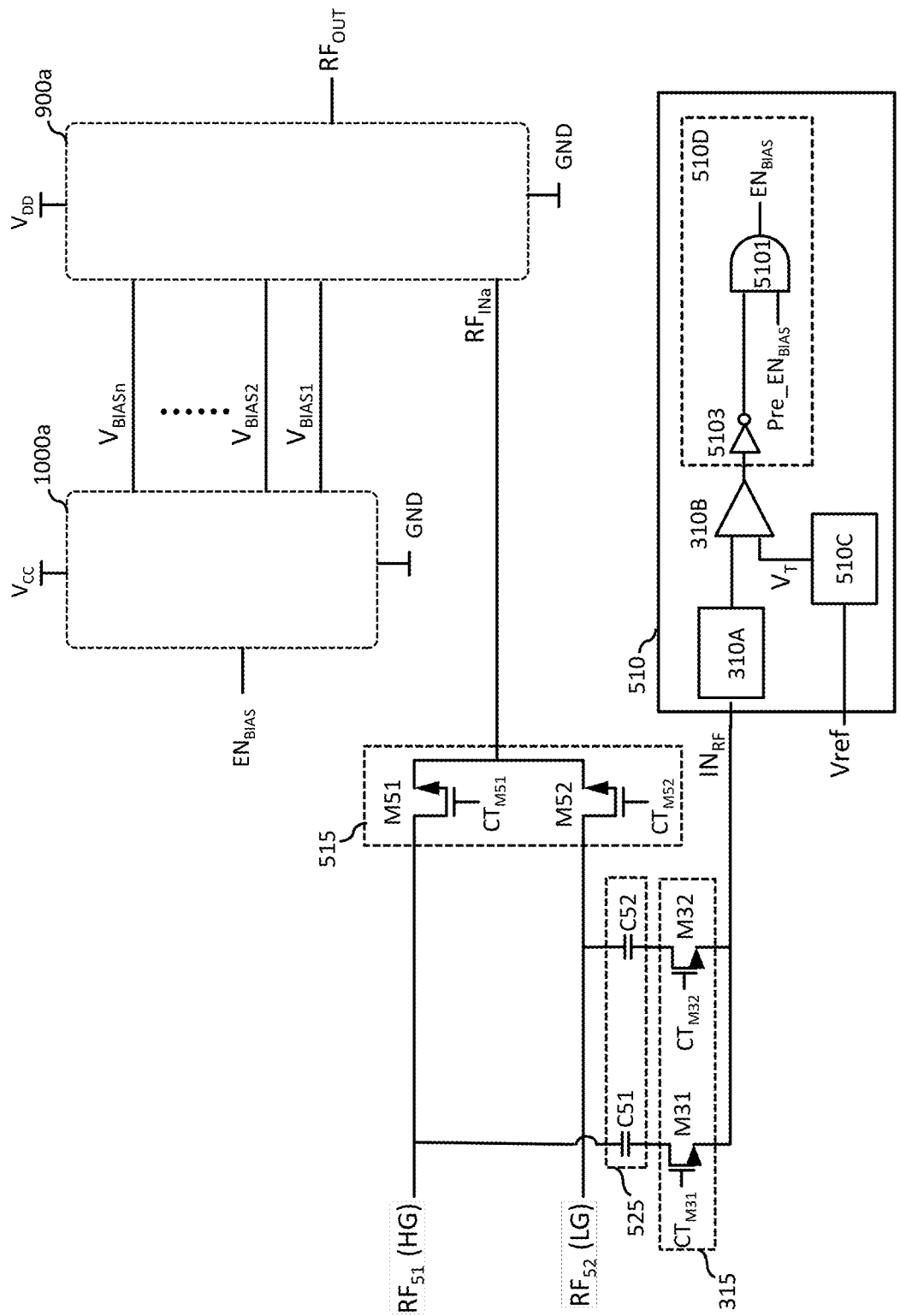
FIG. 10 shows another embodiment according to the present disclosure wherein the protection circuit elements protect a multi-stage cascode amplifier by controlling biasing signals to the amplifier.

FIG. 10 shows an alternative embodiment according to the present disclosure wherein the protection circuit elements (e.g., 315, 510, 515, 525) protect a multi-stage cascode amplifier (900a) by controlling biasing signals ($V_{BIAS1}$, $V_{BIAS2}$, ..., $V_{BIASn}$) to the amplifier. It should be noted that, ss discussed above, one way to protect the circuits from high RF input levels is to switch off or attenuate the RF signal at the input to the circuit being protected. In some cases, the input may be tolerant of the high RF input levels, but the output or other elements in the circuit may be damaged. In these cases, it is possible to switch off the circuit so that while the input is present, it doesn't propagate at damaging levels throughout the circuit. Such protection is performed by controlling a biasing circuit (1000a) that generates the biasing signals ($V_{BIAS1}$, $V_{BIAS2}$, ..., $V_{BIASn}$) based on a detected voltage level of an RF signal processed by an active switchable RF paths (e.g., HG, LG, ...) coupled to the amplifier (900a). Detection of the voltage level being performed via the protection circuit elements (315, 510, 515, 525) described above. As can be clearly understood by a person skilled in the art, when a detected voltage level of the coupled RF signal, $IN_{RF}$, provided to the RF level detector (510) is above the reference trip voltage, $V_T$, a control signal, $EN_{BIAS}$, to the biasing circuit (1000a) may change state to control the biasing circuit (1000a) to generate a different set of basing signals ($V_{BIAS1}$, $V_{BIAS2}$, ..., $V_{BIASn}$) for protection of transistors of the amplifier (900a). Such different set of biasing signals may include a different one or more of the biasing signals ($V_{BIAS1}$, $V_{BIAS2}$, ..., $V_{BIASn}$) when compared to a normal operation.

With continued reference to FIG. 10, according to one exemplary embodiment of the present disclosure, control of the biasing signals ($V_{BIAS1}$, $V_{BIAS2}$, ..., $V_{BIASn}$) may include changing biasing conditions of any one or more of the transistors (e.g., T1, T2, ..., Tn shown in FIG. 9A). According to another exemplary embodiment of the present disclosure, such control of the biasing signals may include changing biasing conditions of any one or more of the transistors (e.g., T1, T2, ..., Tn shown in FIG. 9A) so that no current flows through the amplifier (900a). It should be noted that such control of the biasing circuit (1000a) may be in lieu or in addition of controlling of the transistor switches (e.g., M51, M52) as described above. In FIG. 10, the second input of the logic AND gate (5101) is provided with a control signal, $Pre\_EN_{BIAS}$, which may be generated by a signal aware controller (e.g., transceiver) to control normal operation of the biasing circuit (1000a), such as, for example, enable biasing voltages to the amplifier (900a) for operation according to, for example, an active amplification and an idle (e.g., no amplification) mode. Furthermore, it should be noted that although the exemplary configuration of FIG. 10 shows two switchable RF paths (e.g., $RF_{51}$, $RF_{52}$) and protection circuit elements based on the single-input RF level detector (510), such teachings may equally apply to any number of switchable RF paths (e.g., $RF_{51}$, $RF_{52}$, ..., $RF_{5n}$), including a single RF path, with protection based on any of the above described set of protection circuit elements, including the RF level detectors (310), (510) and (510'). Finally, it should be noted that a supply voltage, $V_{CC}$, provided to the biasing circuit (1000a) may be same as, or different from, the supply voltage $V_{DD}$ provided to the amplifier (900a). According to an exemplary embodiment, such supply voltage, $V_{CC}$, may be same as the reference voltage, Vref, provided to the RF level detector (e.g., 510').

Figure 11A:
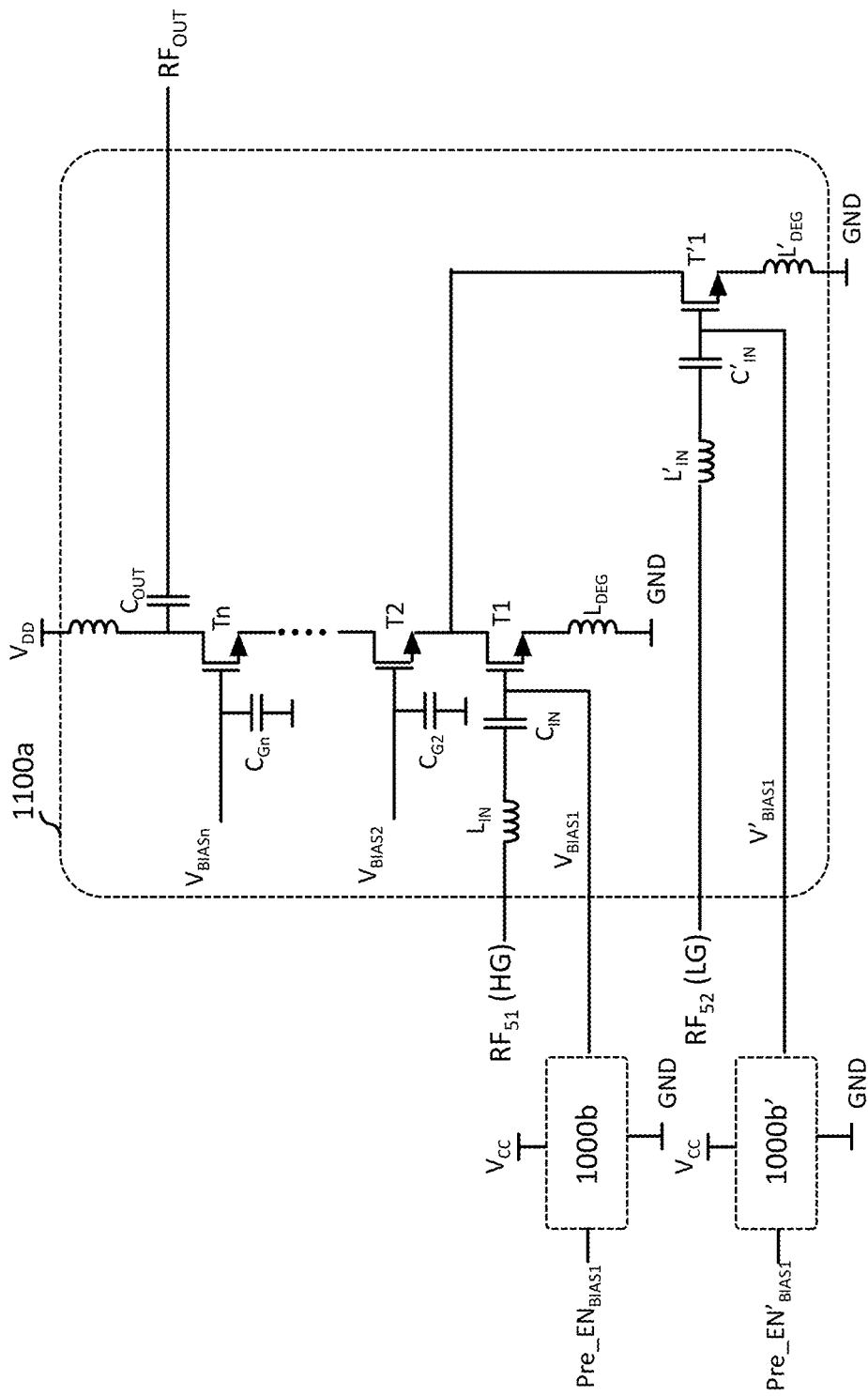
FIG. 11A shows an exemplary multi-input multi-stage cascode amplifier.

FIG. 11A shows an exemplary multi-input multi-stage cascode amplifier (1100a) as known to a person skilled in the art. Such amplifier is based on the multi-stage cascode amplifier (900a) described above with capability of multiple input nodes provided by multiple input transistor stages (e.g., T1, T1') arranged in parallel. Amplification of an input RF signal of a plurality of input RF signals (e.g., $RF_{S1}$, $RF_{S2}$) may be based on a biasing voltage (e.g., $V_{BIAS1}$, $V'_{BIAS1}$) provided to respective gates of the input transistors (e.g., T1, T'1). As shown in FIG. 11A, control of such biasing voltages may be provided via control signals (e.g., $Pre\_EN_{BIAS1}$, $Pre\_EN'_{BIAS1}$) provided to respective biasing circuits (e.g., 1000b, 1000b'). A person skilled in the art would understand that when active, an input transistor (e.g., T1, T'1) may be biased to generate a biasing current through the amplifier (1100a) and when inactive, an input transistor (e.g., T1, T'1) may be biased to be OFF and therefore effectively being removed from the amplifier circuit. More information on principle of operation of the amplifier (1100a) can be found, for example, in the above references U.S. Pat. No. 10,461,704.

Figure 11B:
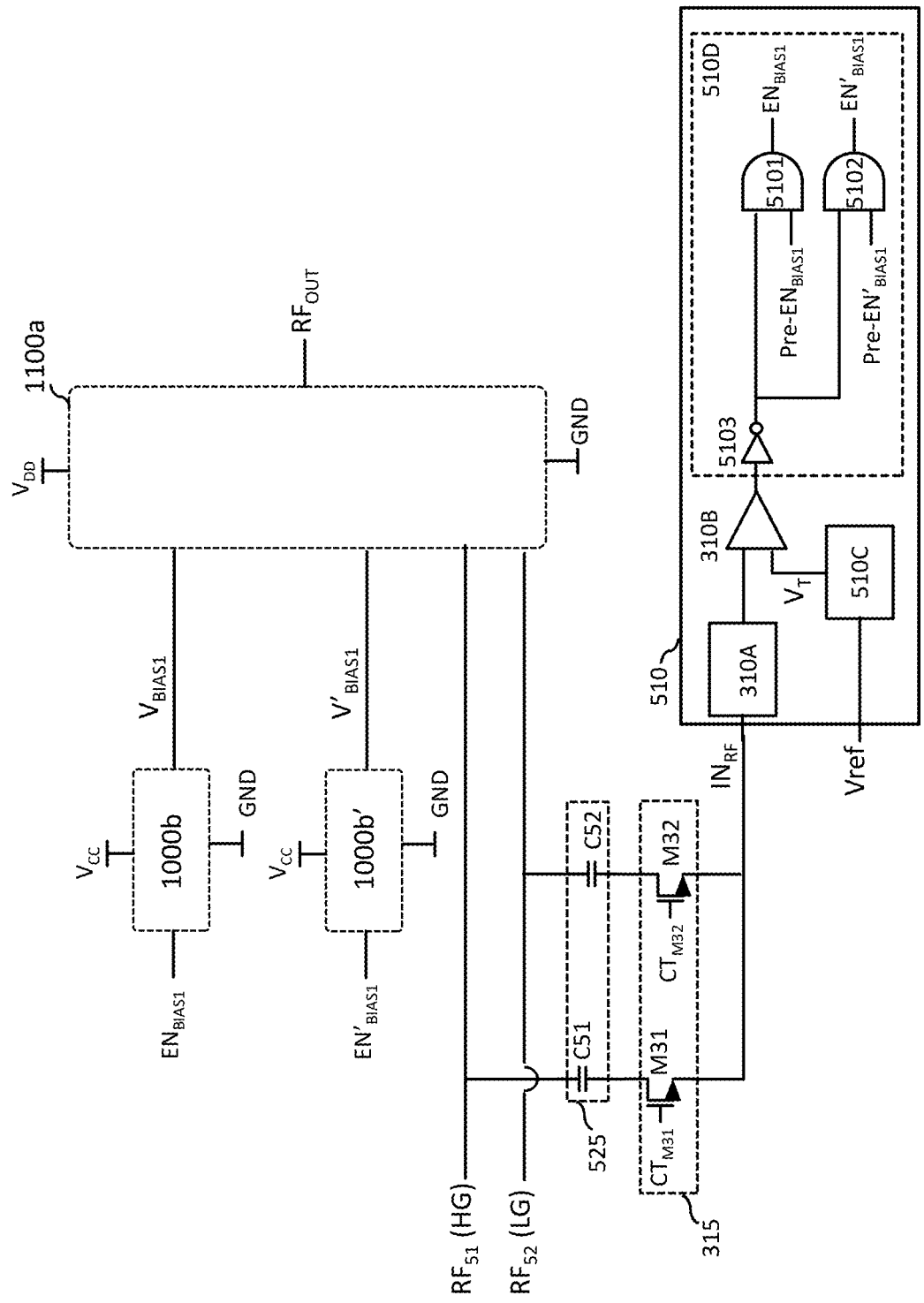

FIG. 11B shows another embodiment according to the present disclosure wherein the protection circuit elements (e.g., 315, 510, 525) protect the multi-input multi-stage cascode amplifier (1100a) by controlling the biasing signals (e.g., $V_{BIAS1}$, $V'_{BIAS1}$) to the input transistors (e.g., T1, T'1 shown in FIG. 11A) of the multi-input multi-stage cascode amplifier (1100a). A person skilled in the art would clearly understand principle of operation of such protection based on the above description. It should be noted that although the exemplary configuration of FIG. 11B shows two switchable RF paths (e.g., $RF_{S1}$, $RF_{S2}$) feeding two inputs of the amplifier (1100a) and protection circuit elements based on the single-input RF level detector (510), such teachings may equally apply to any number of switchable RF paths (e.g., $RF_{S1}$, $RF_{S2}$, ..., $RF_{Sn}$) with protection based on any of the above described set of protection circuit elements, including the RF level detectors (310), (510) and (510').

FIG. 12 is a process chart (1200) showing various steps of a method for protecting an amplifier from higher voltage. As can be seen in the process chart (1200) such steps includes: providing a plurality of switchable RF paths for processing an RF signal through one amplifier according to different modes of operation, each switchable RF path comprising a respective coupling switch that is configured to selectively couple an RF signal to an input of the RF amplifier, per step (1210); selecting a mode of operation, per step (1220); based on the selecting, selecting a path of the plurality of switchable RF path for processing of the RF signal, the selecting comprising controlling a respective coupling switch of a selected path for operation in an ON state, per step (1230); based on the selecting, providing a flow of the RF signal through the respective coupling switch of the selected path and through the amplifier, per step (1240); detecting a voltage level of the RF signal through the selected path, per step (1250); and based on the detecting, if a detected voltage level is above a reference trip voltage, then controlling the respective coupling switch of the selected path for operation in an OFF state, thereby providing a level of isolation of the input of the RF amplifier from the RF signal to protect the RF amplifier, per step (1260).

It should be noted that the various embodiments of the ruggedness protection circuit according to the present disclosure, may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functions without significantly altering the functionality of the disclosed circuits.

The examples set forth above are provided to give those of ordinary skill in the art a complete disclosure and description of how to make and use the embodiments of the gate drivers for stacked transistor amplifiers of the disclosure, and are not intended to limit the scope of what the applicant considers to be the invention. Such embodiments may be, for example, used within mobile handsets for current communication systems (e.g. WCMDA, LTE, WiFi, etc.) wherein amplification of signals with frequency content of above 100 MHz and at power levels of above 50 mW may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A circuital arrangement comprising:
a plurality of switchable RF paths configured to selectively couple a plurality of RF signals to an input of an RF amplifier, each switchable RF path comprising a respective coupling switch that is configured to selectively couple an RF signal of the plurality of RF signals at a first terminal of said switch to the input of the RF amplifier that is coupled to a second terminal of said switch; and
an RF protection circuit configured to protect the input of the RF amplifier from a voltage higher than a reference trip voltage, the RF protection circuit comprising an RF level detector circuit that is coupled to the first terminal of the respective coupling switch of the plurality of switchable RF paths,
wherein
the RF level detector circuit is configured to detect a voltage level of the RF signal through a selected path of the plurality of switchable RF paths at the first terminal of the respective coupling switch, and
if a corresponding detected voltage level is above the reference trip voltage, the RF level detector circuit is configured to generate a control signal to switch a state of the respective coupling switch from an ON state to an OFF state.

2. The circuital arrangement according to claim 1, wherein the respective coupling switch is a transistor switch that is configured to provide a level of isolation of the input of the RF amplifier from the RF signal during the OFF state of said switch to protect the RF amplifier.

3. The circuital arrangement according to claim 2, wherein the level of isolation is in a range from 15 dB to 40 dB.

4. The circuital arrangement according to claim 1, wherein the level of isolation provides an attenuated RF signal at the input of the RF amplifier with high enough RF amplitude to allow uninterrupted processing of RF signal information through the RF amplifier.

5. The circuital arrangement according to claim 1, wherein a coupling of the plurality of switchable RF paths to the RF level detector circuit is provided via a coupler circuit that is configured to provide a coupling of the RF signal in a range from −20 dB to −30 dB.

6. The circuital arrangement according to claim 1, wherein the coupler circuit comprises a plurality of coupling capacitors each coupled between a respective path of the plurality of switchable RF paths and the RF level detector circuit.

7. The circuital arrangement according to claim 6, wherein the RF level detector circuit comprises at least one RF detector circuit coupled to at least one comparator circuit configured to generate the detected voltage level and compare the detected voltage level to the reference trip voltage.

8. The circuital arrangement according to claim 7, wherein
each coupling capacitor is selectively coupled to the at least one RF detector circuit via a switch.

9. The circuital arrangement according to claim 7, wherein:
the at least one RF detector circuit coupled to the at least one comparator circuit comprises a plurality of RF detector circuits each coupled to a respective one of a plurality of comparator circuits, and
each coupling capacitor is coupled to a respective RF detector circuit of the plurality of RF detector circuits.

10. The circuital arrangement according to claim 7, wherein the RF level detector circuit further comprises a logic circuit that is configured to generate the control signal to switch the state of the respective coupling switch based on the detected voltage level and the selected path.

11. The circuital arrangement according to claim 10, wherein the logic circuit comprises:
an inverter circuit coupled to an output of the at least one comparator; and
a logic AND gate having:
a first input coupled to an output of the inverter circuit,
a second input coupled to a control signal indicative of the selected path, and
an output to provide the control signal.

12. The circuital arrangement according to claim 11, wherein the logic circuit further comprises:
additional logic AND gates, each having:
a first input coupled to an output of the inverter circuit,
a second input coupled to a control signal indicative of a respective deselected path of the plurality of switchable RF paths, and an output to provide a control signal to the respective coupling switch of the respective deselected path to maintain the respective coupling switch in an OFF state.

13. The circuital arrangement according to claim 1, wherein:
the plurality of switchable RF paths comprises at least one low gain path comprising a first attenuator, the at least one low gain path configured to provide at least one low gain mode of operation of the circuital arrangement through the at least one low gain path, and
if the corresponding detected voltage level is above the reference trip voltage, the RF level detector circuit is further configured to generate the control signal to:
switch a state of the respective coupling switch of the at least one low gain path from an OFF state to an ON state, and
control the first attenuator to attenuate the RF signal according to an attenuation that provides a desired level of protection of the RF amplifier, said attenuation being different from an attenuation corresponding to the at least one low gain mode of operation.

14. The circuital arrangement according to claim 13, wherein:
the first attenuator is coupled to the input of the RF amplifier via the respective coupling switch of the at least one low gain path.

15. The circuital arrangement according to claim 14, wherein:
the control signal further controls the respective coupling switch of the at least one low gain path to decouple the first attenuator from the input of the RF amplifier.

16. The circuital arrangement according to claim 13, wherein:
the circuital arrangement further comprises an input switch that is configured to selectively couple the RF signal from a plurality of RF signals to the selected path based on a mode of operation of the circuital arrangement, and
the control signal further controls the input switch to switch the flow of the RF signal from the selected path to the at least one low gain path if the selected path is different from the at least one low gain path.

17. The circuital arrangement according to claim 1, wherein the RF amplifier comprises a plurality of series connected transistors arranged in a cascode configuration.

18. The circuital arrangement according to claim 17, wherein said transistors are metal-oxide-semiconductor (MOS) field effect transistors (FETs).

19. The circuital arrangement according to claim 18, wherein said transistors are fabricated using one of: a) silicon-on-insulator (SOI) technology, b) silicon-on-sapphire (SOS) technology, and c) bulk silicon (Si) technology.

20. The circuital arrangement according to claim 1, wherein circuital arrangement is monolithically integrated.

21. An electronic module comprising the circuital arrangement of claim 1.

22. The electronic module of claim 21, wherein the electronic module is a low noise amplifier (LNA) module that supports operation according to a plurality of different gain modes and different bands.

23. A radio frequency (RF) front-end communication system, comprising:
a receiver section for receiving an RF signal according to different modes of operation, the receiver section comprising the circuital arrangement of claim 1.

24. The circuital arrangement according to claim 1, wherein the plurality of RF signals are filtered RF signals based on different frequency bands of operation of the circuital arrangement.

25. The circuital arrangement according to claim 1, wherein the ON state of the respective coupling switch is based on a control signal from a signal aware controller that is separate from the RF level detector circuit.

26. The circuital arrangement according to claim 1, wherein
if the corresponding detected voltage level is above the reference trip voltage, states of the respective coupling switches of deselected paths of the plurality of switchable RF paths remain at an OFF state.

27. A method for protecting an amplifier from higher voltage, the method comprising:
providing a plurality of switchable RF paths for processing an RF signal through one amplifier according to different modes of operation, each switchable RF path comprising a respective coupling switch that is configured to selectively couple an RF signal at a first terminal of said switch to an input of the RF amplifier that is coupled to a second terminal of said switch;
selecting a mode of operation;
based on the selecting, selecting a path of the plurality of switchable RF path for processing of the RF signal, the selecting comprising controlling a respective coupling switch of a selected path for operation in an ON state;
based on the selecting, coupling the RF signal at the first terminal of the respective coupling switch to the input of the amplifier;
detecting a voltage level of the RF signal at the first terminal of the respective coupling switch; and
based on the detecting, if a detected voltage level is above a reference trip voltage, then controlling the respective coupling switch of the selected path for operation in an OFF state, thereby providing a level of isolation of the input of the RF amplifier from the RF signal to protect the RF amplifier.

28. A circuital arrangement comprising:
a plurality of switchable RF paths comprising an RF amplifier, each switchable RF path comprising a respective coupling switch that is configured to selectively couple an RF signal to an input of the RF amplifier; and
an RF level detector circuit that is coupled to the plurality of switchable RF paths,
wherein
the RF level detector circuit is configured to detect a voltage level of the RF signal through a selected path of the plurality of switchable RF paths, the RF signal coupled to the input of the RF amplifier via the respective coupling switch,
if a corresponding detected voltage level is above a reference trip voltage, the RF level detector circuit is configured to generate a control signal to switch a state of the respective coupling switch from an ON state to an OFF state, and
the RF level detector circuit comprises at least one RF detector circuit coupled to at least one comparator circuit configured to generate the detected voltage level and compare the detected voltage level to the reference trip voltage.

* * * * *